United States Patent
Higgins et al.

(10) Patent No.: US 10,546,648 B2
(45) Date of Patent: Jan. 28, 2020

(54) STORAGE CONTROL SYSTEM WITH DATA MANAGEMENT MECHANISM AND METHOD OF OPERATION THEREOF

(71) Applicant: SMART Storage Systems, Inc., Chandler, AZ (US)

(72) Inventors: James M. Higgins, Chandler, AZ (US); James M. Kresse, Gilbert, AZ (US); Ryan Jones, Mesa, AZ (US); Mark Dancho, Chandler, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 784 days.

(21) Appl. No.: 13/862,314

(22) Filed: Apr. 12, 2013

(65) Prior Publication Data

US 2014/0310494 A1    Oct. 16, 2014

(51) Int. Cl.
*G06F 12/02* (2006.01)
*G11C 16/34* (2006.01)

(52) U.S. Cl.
CPC ........ *G11C 16/349* (2013.01); *G06F 12/0246* (2013.01)

(58) Field of Classification Search
CPC .................................................. G06F 12/0246
USPC ........................................................ 711/103
See application file for complete search history.

(56) References Cited

U.S. PATENT DOCUMENTS

| | | | |
|---|---|---|---|
| 4,048,481 A | 9/1977 | Bailey, Jr. et al. | |
| 4,839,587 A | 6/1989 | Flatley et al. | |
| 5,034,744 A | 7/1991 | Obinata | |
| 5,210,854 A | 5/1993 | Beaverton et al. | |
| 5,311,395 A | 5/1994 | McGaha et al. | |
| 5,450,354 A | 9/1995 | Sawada et al. | |
| 5,479,638 A | 12/1995 | Assar et al. | |
| 5,784,174 A | 7/1998 | Fujino et al. | |
| 5,790,828 A | 8/1998 | Jost | |
| 5,930,504 A | 7/1999 | Gabel | |
| 5,949,785 A | 9/1999 | Beasley | |
| 5,963,893 A | 10/1999 | Sakakura et al. | |
| 6,034,897 A | 3/2000 | Estakhri et al. | |
| 6,069,827 A | 5/2000 | Sinclair | |
| 6,091,652 A | 7/2000 | Haehn et al. | |

(Continued)

FOREIGN PATENT DOCUMENTS

| | | |
|---|---|---|
| EP | 1 956 489 A2 | 8/2008 |
| EP | 1 990 921 A2 | 11/2008 |

(Continued)

OTHER PUBLICATIONS

Ulintech, "ATA Command Table (in Alphabetic Order)," Feb. 6, 2011, https://web.archive.org/web/20110206060820/http://www.ulinktech.com/downloads/AT. 6 pages.

(Continued)

*Primary Examiner* — Gautam Sain
(74) *Attorney, Agent, or Firm* — Morgan, Lewis & Bockius LLP

(57) ABSTRACT

A storage control system, and a method of operation thereof, including: a recycle write queue for providing a recycle write; a host write queue for providing a host write; and a scheduler, coupled to the recycle write queue and the host write queue, for scheduling the recycle write and the host write for writing to a memory device.

15 Claims, 8 Drawing Sheets

(56) References Cited

U.S. PATENT DOCUMENTS

| | | |
|---|---|---|
| 6,275,436 B1 | 8/2001 | Tobita et al. |
| 6,345,367 B1 | 2/2002 | Sinclair |
| 6,356,447 B2 | 3/2002 | Scafidi |
| 6,381,176 B1 | 4/2002 | Kim et al. |
| 6,381,670 B1 | 4/2002 | Lee et al. |
| 6,412,080 B1 | 6/2002 | Fleming et al. |
| 6,529,997 B1 | 3/2003 | Debiez et al. |
| 6,552,581 B1 | 4/2003 | Gabara |
| 6,587,915 B1 | 7/2003 | Kim |
| 6,618,249 B2 | 9/2003 | Fairchild |
| 6,661,503 B1 | 12/2003 | Yamaguchi et al. |
| 6,728,913 B1 | 4/2004 | Parker |
| 6,763,424 B2 | 7/2004 | Conley |
| 6,775,792 B2 | 8/2004 | Ulrich et al. |
| 6,778,387 B2 | 8/2004 | Fairchild |
| 6,850,443 B2 | 2/2005 | Lofgren et al. |
| 6,854,070 B2 | 2/2005 | Johnson et al. |
| 6,871,304 B2 | 3/2005 | Hadjihassan et al. |
| 6,903,972 B2 | 6/2005 | Lasser et al. |
| 6,906,961 B2 | 6/2005 | Eggleston et al. |
| 6,975,028 B1 | 12/2005 | Wayburn et al. |
| 7,082,495 B2 | 7/2006 | DeWhitt et al. |
| 7,107,389 B2 | 9/2006 | Inagaki et al. |
| 7,139,864 B2 | 11/2006 | Bennett et al. |
| 7,233,497 B2 | 6/2007 | Simon et al. |
| 7,243,186 B2 | 7/2007 | Liang et al. |
| 7,298,888 B2 | 11/2007 | Hamar |
| 7,330,927 B1 | 2/2008 | Reeve et al. |
| 7,333,364 B2 | 2/2008 | Yu et al. |
| 7,350,101 B1 | 3/2008 | Nguyen et al. |
| 7,355,896 B2 | 4/2008 | Li et al. |
| 7,434,122 B2 | 10/2008 | Jo |
| 7,441,067 B2 | 10/2008 | Gorobets et al. |
| 7,516,267 B2 | 4/2009 | Coulson et al. |
| 7,558,109 B2 | 7/2009 | Brandman et al. |
| 7,613,871 B2 | 11/2009 | Tanaka et al. |
| 7,620,710 B2 | 11/2009 | Kottomtharayil et al. |
| 7,620,769 B2 | 11/2009 | Lee et al. |
| 7,639,532 B2 | 12/2009 | Roohparvar et al. |
| 7,661,054 B2 | 2/2010 | Huffman et al. |
| 7,679,948 B2 | 3/2010 | Park et al. |
| 7,693,422 B2 | 4/2010 | Alicherry et al. |
| 7,738,502 B2 | 6/2010 | Chang et al. |
| 7,743,216 B2 | 6/2010 | Lubbers et al. |
| 7,818,525 B1 | 10/2010 | Frost et al. |
| 7,827,348 B2 | 11/2010 | Lee et al. |
| 7,830,164 B2 | 11/2010 | Earle et al. |
| 7,853,749 B2 | 12/2010 | Kolokowsky |
| 7,979,614 B1 | 7/2011 | Yang |
| 8,000,161 B2 | 8/2011 | Stan et al. |
| 8,001,135 B2 | 8/2011 | Perlmutter et al. |
| 8,010,738 B1 | 8/2011 | Chilton et al. |
| 8,028,123 B2 | 9/2011 | Kilzer et al. |
| 8,046,645 B2 | 10/2011 | Hsu et al. |
| 8,051,241 B2 | 11/2011 | Feldman et al. |
| 8,072,805 B2 | 12/2011 | Chou et al. |
| 8,095,724 B2 | 1/2012 | Ji et al. |
| 8,095,765 B2 | 1/2012 | Asnaashari et al. |
| 8,117,396 B1 | 2/2012 | Fair et al. |
| 8,127,202 B2 | 2/2012 | Cornwell et al. |
| 8,145,984 B2 | 3/2012 | Sommer et al. |
| 8,154,921 B2 | 4/2012 | Mokhlesi et al. |
| 8,169,825 B1 | 5/2012 | Shalvi et al. |
| 8,205,028 B1 | 6/2012 | Sakarda |
| 8,209,677 B2 | 6/2012 | Shintani et al. |
| 8,219,724 B1 | 7/2012 | Caruso et al. |
| 8,219,776 B2 | 7/2012 | Forhan et al. |
| 8,228,701 B2 | 7/2012 | Sokolov et al. |
| 8,245,101 B2 | 8/2012 | Olbrich et al. |
| 8,250,621 B2 | 8/2012 | Cha |
| 8,254,172 B1 | 8/2012 | Kan |
| 8,259,506 B1 | 9/2012 | Sommer et al. |
| 8,289,801 B2 | 10/2012 | Smith et al. |
| 8,296,534 B1 | 10/2012 | Gupta et al. |
| 8,332,578 B2 | 12/2012 | Frickey, III et al. |
| 8,363,413 B2 | 1/2013 | Paquette et al. |
| 8,369,141 B2 | 2/2013 | Sommer et al. |
| 8,385,860 B2 | 2/2013 | Tseng et al. |
| 8,386,700 B2 | 2/2013 | Olbrich et al. |
| 8,397,101 B2 | 3/2013 | Goss et al. |
| 8,407,409 B2 | 3/2013 | Kawaguchi |
| 8,464,106 B2 | 6/2013 | Filor et al. |
| 8,503,238 B1 | 8/2013 | Wu et al. |
| 8,521,981 B2 | 8/2013 | Strauss et al. |
| 8,560,770 B2 | 10/2013 | Haines et al. |
| 8,601,203 B2 | 12/2013 | Holbrook et al. |
| 8,612,669 B1 | 12/2013 | Syu et al. |
| 8,612,804 B1 | 12/2013 | Kang et al. |
| 8,661,184 B2 | 2/2014 | Wood et al. |
| 8,694,811 B2 | 4/2014 | Raju et al. |
| 8,725,931 B1 * | 5/2014 | Kang .................. G06F 13/1642 710/52 |
| 8,750,052 B2 | 6/2014 | Aoki et al. |
| 8,793,556 B1 | 7/2014 | Northcott et al. |
| 8,799,747 B2 | 8/2014 | Goss et al. |
| 8,832,506 B2 | 9/2014 | Griffin et al. |
| 8,862,818 B1 | 10/2014 | Ozdemir |
| 8,880,838 B2 | 11/2014 | Kaiser et al. |
| 8,984,216 B2 | 3/2015 | Fillingim |
| 9,043,668 B2 | 5/2015 | Goss et al. |
| 9,063,844 B2 | 6/2015 | Higgins et al. |
| 9,069,468 B2 | 6/2015 | Mehra et al. |
| 9,116,401 B2 | 8/2015 | Kim et al. |
| 2002/0056025 A1 | 5/2002 | Qiu et al. |
| 2002/0156891 A1 | 10/2002 | Ulrich et al. |
| 2002/0159285 A1 | 10/2002 | Morley et al. |
| 2003/0033308 A1 | 2/2003 | Patel et al. |
| 2003/0046603 A1 | 3/2003 | Harari et al. |
| 2003/0074592 A1 | 4/2003 | Hasegawa |
| 2003/0163633 A1 | 8/2003 | Aasheim et al. |
| 2004/0080985 A1 | 4/2004 | Chang et al. |
| 2004/0088511 A1 | 5/2004 | Bacon et al. |
| 2004/0252670 A1 | 12/2004 | Rong et al. |
| 2005/0021904 A1 | 1/2005 | Iaculo et al. |
| 2005/0038792 A1 | 2/2005 | Johnson |
| 2005/0073884 A1 | 4/2005 | Gonzalez et al. |
| 2005/0076102 A1 | 4/2005 | Chen et al. |
| 2005/0144516 A1 | 6/2005 | Gonzalez et al. |
| 2006/0015683 A1 | 1/2006 | Ashmore et al. |
| 2006/0020745 A1 | 1/2006 | Conley et al. |
| 2006/0022054 A1 | 2/2006 | Elhamias et al. |
| 2006/0080505 A1 | 4/2006 | Arai et al. |
| 2006/0136682 A1 | 6/2006 | Haridas et al. |
| 2006/0143365 A1 | 6/2006 | Kikuchi |
| 2006/0143475 A1 | 6/2006 | Herbert et al. |
| 2006/0253641 A1 | 11/2006 | Gatzemeier et al. |
| 2006/0256624 A1 | 11/2006 | Eggleston et al. |
| 2006/0282644 A1 | 12/2006 | Wong |
| 2006/0294574 A1 | 12/2006 | Cha |
| 2007/0050536 A1 | 3/2007 | Kolokowsky |
| 2007/0061511 A1 | 3/2007 | Faber |
| 2007/0067598 A1 | 3/2007 | Fujimoto |
| 2007/0079152 A1 | 4/2007 | Winick et al. |
| 2007/0083779 A1 | 4/2007 | Misaka et al. |
| 2007/0226592 A1 | 9/2007 | Radke |
| 2007/0234004 A1 | 10/2007 | Oshima et al. |
| 2007/0260811 A1 | 11/2007 | Merry, Jr. et al. |
| 2007/0263444 A1 | 11/2007 | Gorobets et al. |
| 2007/0276973 A1 | 11/2007 | Tan et al. |
| 2008/0028246 A1 | 1/2008 | Witham |
| 2008/0046630 A1 | 2/2008 | Lasser |
| 2008/0052446 A1 | 2/2008 | Lasser et al. |
| 2008/0082736 A1 | 4/2008 | Chow et al. |
| 2008/0126720 A1 | 5/2008 | Danilak |
| 2008/0183918 A1 | 7/2008 | Dhokia et al. |
| 2008/0189588 A1 | 8/2008 | Tanaka et al. |
| 2008/0263289 A1 | 10/2008 | Hosoya et al. |
| 2008/0313505 A1 | 12/2008 | Lee et al. |
| 2009/0006900 A1 | 1/2009 | Lastras-Montano et al. |
| 2009/0019321 A1 | 1/2009 | Radke |
| 2009/0070651 A1 | 3/2009 | Diggs et al. |
| 2009/0083587 A1 | 3/2009 | Ng et al. |
| 2009/0089485 A1 | 4/2009 | Yeh |
| 2009/0091990 A1 | 4/2009 | Park et al. |

(56) References Cited

U.S. PATENT DOCUMENTS

| | | |
|---|---|---|
| 2009/0109786 A1 | 4/2009 | Ye et al. |
| 2009/0125670 A1 | 5/2009 | Keays |
| 2009/0132756 A1 | 5/2009 | Hsieh |
| 2009/0138654 A1 | 5/2009 | Sutardja |
| 2009/0146721 A1 | 6/2009 | Kurooka et al. |
| 2009/0157948 A1 | 6/2009 | Trichina et al. |
| 2009/0164702 A1 | 6/2009 | Kern |
| 2009/0164710 A1 | 6/2009 | Choi et al. |
| 2009/0172248 A1 | 7/2009 | You |
| 2009/0172262 A1 | 7/2009 | Olbrich et al. |
| 2009/0179707 A1* | 7/2009 | Higashino ............... 331/17 |
| 2009/0183183 A1 | 7/2009 | Muppirala et al. |
| 2009/0228634 A1 | 9/2009 | Nakamura et al. |
| 2009/0228761 A1 | 9/2009 | Perlmutter et al. |
| 2009/0259819 A1 | 10/2009 | Chen et al. |
| 2009/0259896 A1 | 10/2009 | Hsu et al. |
| 2009/0271562 A1 | 10/2009 | Sinclair |
| 2009/0287975 A1 | 11/2009 | Kim et al. |
| 2009/0300238 A1 | 12/2009 | Panabaker et al. |
| 2009/0323419 A1 | 12/2009 | Lee et al. |
| 2009/0327581 A1 | 12/2009 | Coulson |
| 2009/0327591 A1 | 12/2009 | Moshayedi |
| 2010/0017650 A1 | 1/2010 | Chin et al. |
| 2010/0023674 A1 | 1/2010 | Aviles |
| 2010/0050053 A1 | 2/2010 | Wilson et al. |
| 2010/0082890 A1 | 4/2010 | Heo et al. |
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0325340 A1 | 12/2010 | Feldman et al. |
| 2010/0332726 A1* | 12/2010 | Wang ............... 711/103 |
| 2011/0002224 A1 | 1/2011 | Tamura |
| 2011/0016239 A1 | 1/2011 | Stenfort |
| 2011/0055455 A1* | 3/2011 | Post ............... G06F 12/0246 711/103 |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0099342 A1 | 4/2011 | Ozdemir |
| 2011/0107144 A1 | 5/2011 | Ohara |
| 2011/0131365 A1 | 6/2011 | Zhang et al. |
| 2011/0131447 A1 | 6/2011 | Prakash et al. |
| 2011/0132000 A1 | 6/2011 | Deane et al. |
| 2011/0138100 A1 | 6/2011 | Sinclair |
| 2011/0145473 A1 | 6/2011 | Maheshwari |
| 2011/0161775 A1 | 6/2011 | Weingarten |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0209032 A1 | 8/2011 | Choi et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0023144 A1 | 1/2012 | Rub |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0079348 A1 | 3/2012 | Naeimi |
| 2012/0079355 A1 | 3/2012 | Patapoutian et al. |
| 2012/0096217 A1 | 4/2012 | Son et al. |
| 2012/0124046 A1 | 5/2012 | Provenzano |
| 2012/0124273 A1 | 5/2012 | Goss et al. |
| 2012/0151260 A1 | 6/2012 | Zimmermann et al. |
| 2012/0170365 A1 | 7/2012 | Kang et al. |
| 2012/0185706 A1 | 7/2012 | Sistla et al. |
| 2012/0213004 A1 | 8/2012 | Yun et al. |
| 2012/0216085 A1 | 8/2012 | Weingarten et al. |
| 2012/0236656 A1 | 9/2012 | Cometti |
| 2012/0239858 A1 | 9/2012 | Melik-Martirosian |
| 2012/0254686 A1 | 10/2012 | Esumi et al. |
| 2012/0266011 A1 | 10/2012 | Storer et al. |
| 2012/0266048 A1 | 10/2012 | Chung et al. |
| 2012/0278530 A1* | 11/2012 | Ebsen ............... 711/103 |
| 2012/0278531 A1 | 11/2012 | Horn |
| 2012/0284587 A1 | 11/2012 | Yu et al. |
| 2012/0297113 A1 | 11/2012 | Belluomini et al. |
| 2012/0311402 A1 | 12/2012 | Tseng et al. |
| 2012/0317334 A1 | 12/2012 | Suzuki et al. |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0061019 A1* | 3/2013 | Fitzpatrick et al. ............ 711/173 |
| 2013/0073788 A1 | 3/2013 | Post et al. |
| 2013/0073797 A1 | 3/2013 | Chowdhury |
| 2013/0074093 A1 | 3/2013 | Gounares et al. |
| 2013/0080691 A1 | 3/2013 | Weingarten et al. |
| 2013/0094289 A1 | 4/2013 | Sridharan et al. |
| 2013/0100600 A1 | 4/2013 | Yin et al. |
| 2013/0104005 A1 | 4/2013 | Weingarten et al. |
| 2013/0124792 A1 | 5/2013 | Melik-Martirosian et al. |
| 2013/0151753 A1 | 6/2013 | Jeon et al. |
| 2013/0198436 A1 | 8/2013 | Bandic et al. |
| 2013/0205102 A1 | 8/2013 | Jones et al. |
| 2013/0219248 A1 | 8/2013 | Sakurai |
| 2013/0232290 A1* | 9/2013 | Ish et al. ............... 711/103 |
| 2013/0238833 A1 | 9/2013 | Vogan et al. |
| 2013/0265825 A1 | 10/2013 | Lassa |
| 2013/0304998 A1 | 11/2013 | Palmer |
| 2013/0326116 A1 | 12/2013 | Goss et al. |
| 2013/0332791 A1 | 12/2013 | Chu |
| 2014/0036589 A1 | 2/2014 | Parthasarathy et al. |
| 2014/0059359 A1 | 2/2014 | Bahirat |
| 2014/0108891 A1 | 4/2014 | Strasser et al. |
| 2014/0129874 A1 | 5/2014 | Zaltsman et al. |
| 2014/0158525 A1 | 6/2014 | Greene |
| 2014/0181370 A1* | 6/2014 | Cohen et al. ............... 711/103 |
| 2014/0208174 A1 | 7/2014 | Ellis et al. |
| 2014/0258769 A1 | 9/2014 | Baryudin et al. |
| 2014/0372777 A1 | 12/2014 | Reller et al. |

FOREIGN PATENT DOCUMENTS

| | | |
|---|---|---|
| EP | 2 498 259 A2 | 9/2012 |
| JP | 2012129859 A | 7/2012 |
| WO | WO 2009/042298 A1 | 4/2009 |
| WO | WO 2011/156466 | 12/2011 |

OTHER PUBLICATIONS

International Search Report dated Mar. 25, 2014, received in International Patent Application No. PCT/US2013/072400, which corresponds to U.S. Appl. No. 13/690,337, 3 pages (Ellis)

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31, 2014, received in International Patent Application No. PCT/US2014/031465, which corresponds to U.S. Appl. No. 13/851,928, 13 pages (Ellis).

(56) References Cited

OTHER PUBLICATIONS

International Search Report and Written Opinion dated Jul. 31, 2014, received in International Patent Application No. PCT/US2014/033876, which corresponds to U.S. Appl. No. 13/861,326, 9 pages (Fitzpatrick).

International Search Report and Written Opinion dated Nov. 7, 2014, received in International Patent Application No. PCT/US2014/049732, which corresponds to U.S. Appl. No. 14/334,350, 13 pages (Fitzpatrick).

International Search Report and Written Opinion dated Oct. 17, 2014, received in International Patent Application No. PCT/US2014/049734, which correpsonds to U.S. Appl. No. 14/332,359, 8 pages (Higgins).

International Search Report and Written Opinion dated Oct. 23, 2014, received in International Patent Application No. PCT/US2014/049736, which corresponds to U.S. Appl. No. 14/446,249, 8 pages (Fitzpatrick).

International Search Report and Written Opinion dated Nov. 5, 2014, received in International Patent Application No. PCT/US2014/049282, which corresponds to U.S. Appl. No. 13/957,407, 12 pages (Fitzpatrick).

Tseng et al., "Understanding the Impact of Power Loss on Flash Memory," DAC'11, Jun. 5-10, 2011, San Diego, California, 6 pages.

International Search Report and Written Opinion dated Aug. 22, 2014, received in International Patent Application No. PCT/US2014/032978, which corresponds to U.S. Appl. No. 14/081,992, 10 pages (Ellis).

Cooke, "Introduction to Flash Memory (T1A)," Flash Memory Summit, Aug. 22, 2008, Micron Technology, Inc., 102 pages.

Gal et al., "Algorithms and Data Structures for Flash Memories," ACM Computing Surveys, Jun. 2005, vol. 37, No. 2, 30 pages.

IBM Corporation, "Systems Management, Work Management," Version 5, Release 4, 9th Edition, Feb. 2006, pp. 1-21.

Spanjer, "Flash Management—Why and How?" Smart Modular Technologies, Nov. 2009, http://www.scantec.de/fileadmin/pdf/Smart_Modular/Flash-Management.pdf, 14 pages.

Texas Instruments, "Power Management IC for Digital Set Top Boxes," SLVSA10A, Sep. 2009, pp. 1-22.

International Search Report and Written Opinion dated Dec. 20, 2013, received in PCT/US2013/045282, which corresponds to U.S. Appl. No. 13/493,949, 7 pages (Ellis).

International Search Report and Written Opinion dated Jun. 12, 2014, received in PCT/US2014/018972, which corresponds to U.S. Appl. No. 13/779,352, 12 pages (Schmier).

International Search Report and Written Opinion dated May 14, 2014, received in International Patent Application No. PCT/US2014/017168, which corresponds to U.S. Appl. No. 14/076,115, 6 pages (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

Obrien, "SMART Storage Systems Optimus SAS Enterprise SSD Review", "StorageReview.com", Oct. 9, 2012, pp. 1-44.

Narayanan et al., "Migrating Server Storage to SSDs: Analysis of Tradeoffs," Computer Systems, Apr. 2009, 12 pages.

Shiraz et al., "Block Aging Prevention Technique (BAP) for Flash Based Solict State Disks," 7th International Conference on Emerging Technologies (ICET), Sep. 5, 2011, 6 pages.

Tai et al, "Prolongation of Lifetime and the Evaluation Method of Dependable SSD," 25 International Symposium on Defect and Fault Tolerance in VLSI Systems, 2010, NJ, USA, 8 pages.

Yimo et al., "WeLe-RAID: A SSD-Based RAID for System Endurance and Performance," Jan. 2011, Network and Parallel Computing, Springer, 14 pages.

International Search Report and Written Opinion dated Jan. 9, 2035, received in International Patent Application No. PCT/US2014/049731, which corresponds to U.S. Appl. No. 14/334,324, 9 pages (Fitzpatrick).

International Search Report and Written Opinion dated Feb. 18, 2015, received in International Patent Application No. PCT/US2014/065401, which corresponds to U.S. Appl. No. 14/081,031, 9 pages (Higgins).

International Search Report dated Apr. 15, 2014, received in International Patent Application No. PCT/US2013/078340, which corresponds to U.S. Appl. No. 13/746,542, 11 pages (Ellis).

Online Merriam Webster Dictionary, definition of "Distinct" from Jun. 12, 2011, https://web.archive.org/web/20110612181129/http://www2.merriam-webster.com/cgi-bin/mwdictadu?book=Dictionary&va=distinct.

* cited by examiner

STORAGE CONTROL SYSTEM WITH DATA MANAGEMENT MECHANISM AND METHOD OF OPERATION THEREOF

TECHNICAL FIELD

The present invention relates generally to a storage control system and more particularly to a system for data management.

BACKGROUND ART

Data storage, often called storage or memory, refers to computer components and recording media that retain digital data. Data storage is a core function and fundamental component of consumer and industrial electronics, especially devices such as computers, televisions, cellular phones, mobile devices, and digital video cameras.

Recently, forms of long-term storage other than electromechanical hard disks have become feasible for use in computers. NOT-AND (NAND) flash is one form of non-volatile memory used in solid-state storage devices. The memory cells are arranged in typical row and column fashion with circuitry for accessing individual cells. The memory transistors of those cells are placed to store an analog value that can be interpreted to hold two logical states in the case of Single Level Cell (SLC) or more than two logical states in the case of Multi Level Cell (MLC).

A flash memory cell is light in weight, occupies very little space, and consumes less power than electromechanical disk drives. Construction of a storage system with this type of memory allows for much higher bandwidths and input/output operations per second (IOPS) than typical electromechanical disk drives. More importantly, it is especially rugged and can operate at a much high temperature range. It will withstand without adverse effects repeated drops, each of which would destroy a typical electromechanical hard disk drive. A problem exhibited by flash memory is that it tends to have a limited life in use.

Thus, a need still remains for better data management devices. In view of the increasing demand for data management devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a storage control system, including: receiving a recycle write from a recycle write queue; receiving a host write from a host write queue; and scheduling the recycle write and the host write for writing to a memory device.

The present invention provides a storage control system, including: a recycle write queue for providing a recycle write; a host write queue for providing a host write; and a scheduler, coupled to the recycle write queue and the host write queue, for scheduling the recycle write and the host write for writing to a memory device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
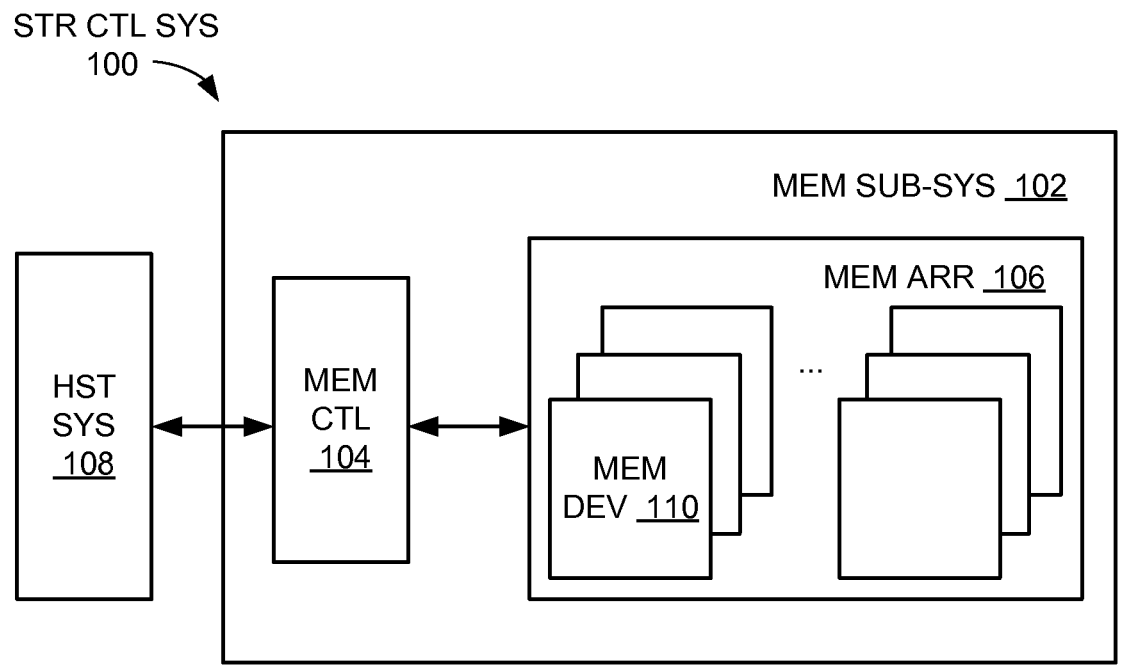
FIG. 1 is a storage control system with data management mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "module" referred to herein can include software, hardware, or a combination thereof in the present invention in accordance with the context in which the term is used. For example, the software can be machine code, firmware, embedded code, and application software. Also for example, the hardware can be circuitry, processor, computer, integrated circuit, integrated circuit cores, a microelectromechanical system (MEMS), passive devices, environmental sensors including temperature sensors, or a combination thereof.

Referring now to FIG. 1, therein is shown a storage control system 100 with data management mechanism in an embodiment of the present invention. The storage control system 100 includes a memory sub-system 102 having a memory controller 104 and a memory array 106. The storage control system 100 includes a host system 108 communicating with the memory sub-system 102.

The memory controller 104 provides data control and management of the memory array 106. The memory controller 104 interfaces with the host system 108 and controls the memory array 106 to transfer data between the host system 108 and the memory array 106.

The memory array 106 includes an array of memory devices 110 including flash memory devices or non-volatile memory devices. The memory array 106 can include pages of data or information. The host system 108 can request the memory controller 104 for reading, writing, and deleting data from or to a logical address space of a storage device or the memory sub-system 102 that includes the memory array 106.

Figure 2:
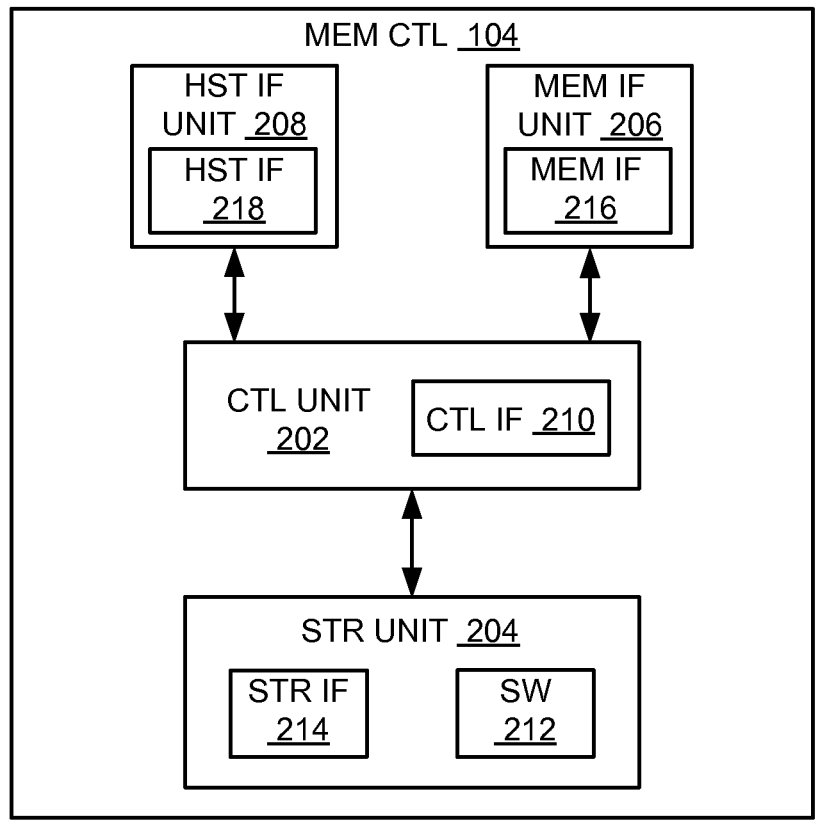
FIG. 2 is an exemplary hardware block diagram of the memory controller.

Referring now to FIG. 2, therein is shown an exemplary hardware block diagram of the memory controller 104. The memory controller 104 can include a control unit 202, a storage unit 204, a memory interface unit 206, and a host interface unit 208. The control unit 202 can include a control interface 210. The control unit 202 can execute software 212 stored in the storage unit 204 to provide the intelligence of the memory controller 104.

The control unit 202 can be implemented in a number of different manners. For example, the control unit 202 can be a processor, an embedded processor, a microprocessor, a hardware control logic, a hardware finite state machine (FSM), a digital signal processor (DSP), or a combination thereof.

The control interface 210 can be used for communication between the control unit 202 and other functional units in the memory controller 104. The control interface 210 can also be used for communication that is external to the memory controller 104.

The control interface 210 can receive information from the other functional units or from external sources, or can transmit information to the other functional units or to external destinations. The external sources and the external destinations refer to sources and destinations external to the memory controller 104.

The control interface 210 can be implemented in different ways and can include different implementations depending on which functional units or external units are being interfaced with the control interface 210. For example, the control interface 210 can be implemented with a dedicated hardware including an application-specific integrated circuit (ASIC), a configurable hardware including a field-programmable gate array (FPGA), a discrete electronic hardware, or a combination thereof.

The storage unit 204 can include both hardware and the software 212. For example, the software 212 can include control firmware. The storage unit 204 can include a volatile memory, a nonvolatile memory, an internal memory, an external memory, or a combination thereof. For example, the storage unit 204 can be a nonvolatile storage such as non-volatile random access memory (NVRAM), Flash memory, disk storage, or a volatile storage such as static random access memory (SRAM).

The storage unit 204 can include a storage interface 214. The storage interface 214 can also be used for communication that is external to the memory controller 104. The storage interface 214 can receive information from the other functional units or from external sources, or can transmit information to the other functional units or to external destinations. The external sources and the external destinations refer to sources and destinations external to the memory controller 104.

The storage interface 214 can include different implementations depending on which functional units or external units are being interfaced with the storage unit 204. The storage interface 214 can be implemented with technologies and techniques similar to the implementation of the control interface 210.

The memory interface unit 206 can enable external communication to and from the memory controller 104. For example, the memory interface unit 206 can permit the memory controller 104 to communicate with the memory array 106 of FIG. 1.

The memory interface unit 206 can include a memory interface 216. The memory interface 216 can be used for communication between the memory interface unit 206 and other functional units in the memory controller 104. The memory interface 216 can receive information from the other functional units or can transmit information to the other functional units.

The memory interface 216 can include different implementations depending on which functional units are being interfaced with the memory interface unit 206. The memory interface 216 can be implemented with technologies and techniques similar to the implementation of the control interface 210.

The host interface unit 208 allows the host system 108 of FIG. 1 to interface and interact with the memory controller 104. The host interface unit 208 can include a host interface 218 to provide communication mechanism between the host interface unit 208 and the host system 108.

The control unit 202 can operate the host interface unit 208 to send control or status information generated by the memory controller 104 to the host system 108. The control unit 202 can also execute the software 212 for the other functions of the memory controller 104. The control unit 202 can further execute the software 212 for interaction with the memory array 106 via the memory interface unit 206.

The functional units in the memory controller 104 can work individually and independently of the other functional units. For illustrative purposes, the memory controller 104 is described by operation of the memory controller 104 with the host system 108 and the memory array 106. It is understood that the memory controller 104, the host system 108, and the memory array 106 can operate any of the modules and functions of the memory controller 104.

Figure 3:
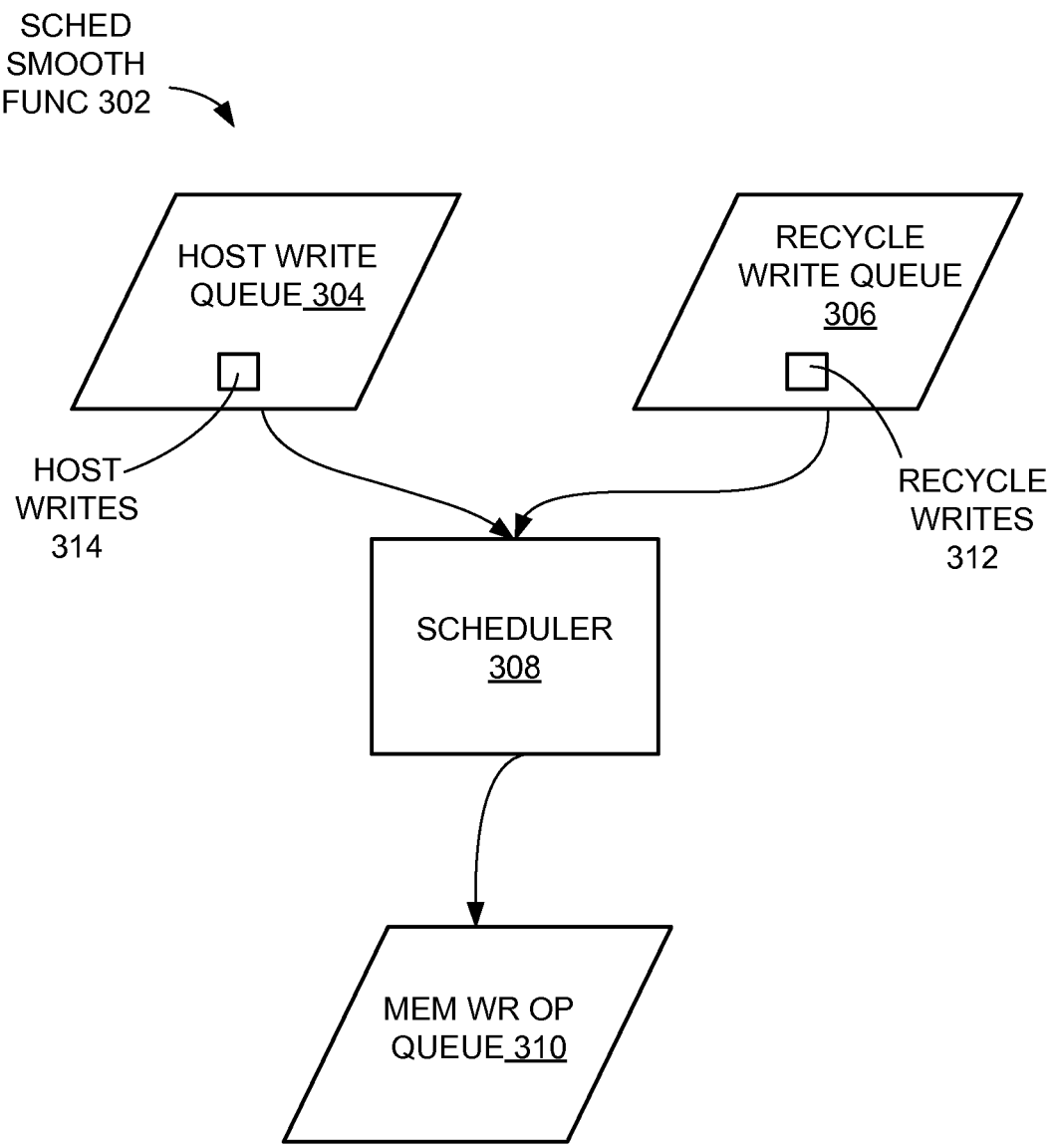
FIG. 3 is a functional block diagram of a scheduler smoothing function of the memory controller of FIG. 1.

Referring now to FIG. 3, therein is shown a functional block diagram of a scheduler smoothing function 302 of the memory controller 104 of FIG. 1. Generally, the scheduler smoothing function 302 can be employed in the storage control system 100 of FIG. 1 and more specifically in the memory controller 104. However, it is to be understood that the preceding examples are not meant to be limiting and the scheduler smoothing function 302 can be employed in any type of system that requires data management.

Generally, the scheduler smoothing function 302 can include a host write queue 304, a recycle write queue 306, a scheduler 308, and a memory write operation queue 310. The memory write operation queue 310 can interleave host and recycle writes to the memory devices 110 of FIG. 1 including flash devices. In at least one embodiment, the scheduler 308 can receive inputs from one or both of the host write queue 304 and the recycle write queue 306 to create an output write sequence that is delivered and implemented by the memory write operation queue 310 within the storage control system 100.

Per the embodiments described herein, the term "host write" is defined herein as a physical write of new data from the host system 108 of FIG. 1 to write to a particular logical address range. Per the embodiments described herein, the term "recycle write" is defined herein as a physical write of data that the drive is moving due to recycling. Per the embodiments described herein, the term "scheduler" is defined herein as a module in the memory controller 104 including a solid-state drive (SSD) responsible for determining which operations to perform next to the memory devices 110.

In general, the host write queue 304 can perform operations such as reads and writes submitted by a system external to the memory sub-system 102 of FIG. 1. The recycle write queue 306 can perform operations including recycle writes 312, such as reads, writes, and erases that the storage control system 100 must perform in order to free up space for host writes 314 and to maintain data integrity.

During operation of the scheduler smoothing function 302, the host write queue 304 can send a host write request to the scheduler smoothing function 302. The host write request can be associated with a physical write of new data from the host system 108 to write to a particular logical address range. Per the embodiments described herein, the term "physical write" is defined herein as a write that goes to an end storage element of a system of memory, such as a volatile memory or a non-volatile memory including a NAND flash device.

During operation of the scheduler smoothing function 302, the recycle write queue 306 can also send a recycle write request to the scheduler smoothing function 302. The recycle write request can be associated with a physical write of data that the storage control system 100 is moving due to recycling. Per the embodiments described herein, the term "recycling" is defined herein as moving data from one page to another page, for purposes of either freeing up erase blocks to write new host data or to ensure that data on the erase blocks is preserved. Recycling can also be referred to as garbage collection.

Per the embodiments described herein, the term "erase block" is defined herein as a group of pages that is the smallest number of pages that can be erased at one time. Per the embodiments described herein, the term "page" is defined herein as the smallest group of data bytes that can be read from or written to in an erase block.

It is to be understood that write requests from the host write queue 304 and the recycle write queue 306 can include any type of write operation or request, such as competing writes, metadata writes, RAID/parity writes, etc.

After receiving a number of host write requests and/or recycle write requests, the scheduler smoothing function 302 can then determine which write operation or sequence of write operations to perform next to optimize performance of the storage control system 100. By way of example and not by way of limitation, the storage control system 100 can be optimized by providing a steady host performance to the user, a consistent host command latency period to the user, and/or maintenance of a desired recycle ratio.

Per the embodiments described herein, the term "recycle ratio" is defined herein as a number of logical pages that are written for recycling compared to a total number of data writes. Per the embodiments described herein, the term "host performance" is defined herein generally as how much work the host system 108 achieves when interfacing to the memory controller 104 including the SSD. For example, key measurements for the host performance can include throughput, average latency, worst-case latency, and latency deviation. The key measurements can be applied to any combinations of host write and host read distributions, sizes, and queue depths.

Once the scheduler smoothing function 302 has determined the correct write operation or sequence of write operations to perform next, the scheduler smoothing function 302 can then send this instruction to the memory write operation queue 310 for implementation within the memory array 106 of FIG. 1.

Functions or operations of the memory controller 104 as described above can be implemented in hardware, software, or a combination thereof. The memory controller 104 can be implemented with the control unit 202 of FIG. 2, the storage unit 204 of FIG. 2, the memory interface unit 206 of FIG. 2, the host interface unit 208 of FIG. 2, or a combination thereof.

For example, the host write queue 304 can be implemented with the control unit 202 and the storage unit 204 to store and provide the host writes 314. Also for example, the recycle write queue 306 can be implemented with the control unit 202 and the storage unit 204 to store and provide the recycle writes 312.

For example, the scheduler 308 can be implemented with the control unit 202 to receive inputs from one or both of the host write queue 304 and the recycle write queue 306 to create an output write sequence that is delivered and implemented by the memory write operation queue 310. Also for example, the memory write operation queue 310 can be implemented with the control unit 202 and the storage unit 204 to receive sequence of write operations to perform next from the scheduler 308.

The host write queue 304 and the recycle write queue 306 can be coupled to the scheduler 308. The scheduler 308 can be coupled to the memory write operation queue 310.

The storage control system 100 is described with module functions or order as an example. The modules can be partitioned differently. For example, the scheduler 308 and the memory write operation queue 310 can be combined. Each of the modules can operate individually and independently of the other modules.

Furthermore, data generated in one module can be used by another module without being directly coupled to each other. The host write queue 304, the recycle write queue 306, the scheduler 308, and the memory write operation queue 310 can be implemented as hardware accelerators (not shown) within the control unit 202 or can be implemented as hardware accelerators (not shown) in the memory controller 104 or outside of the memory controller 104.

Figure 4:
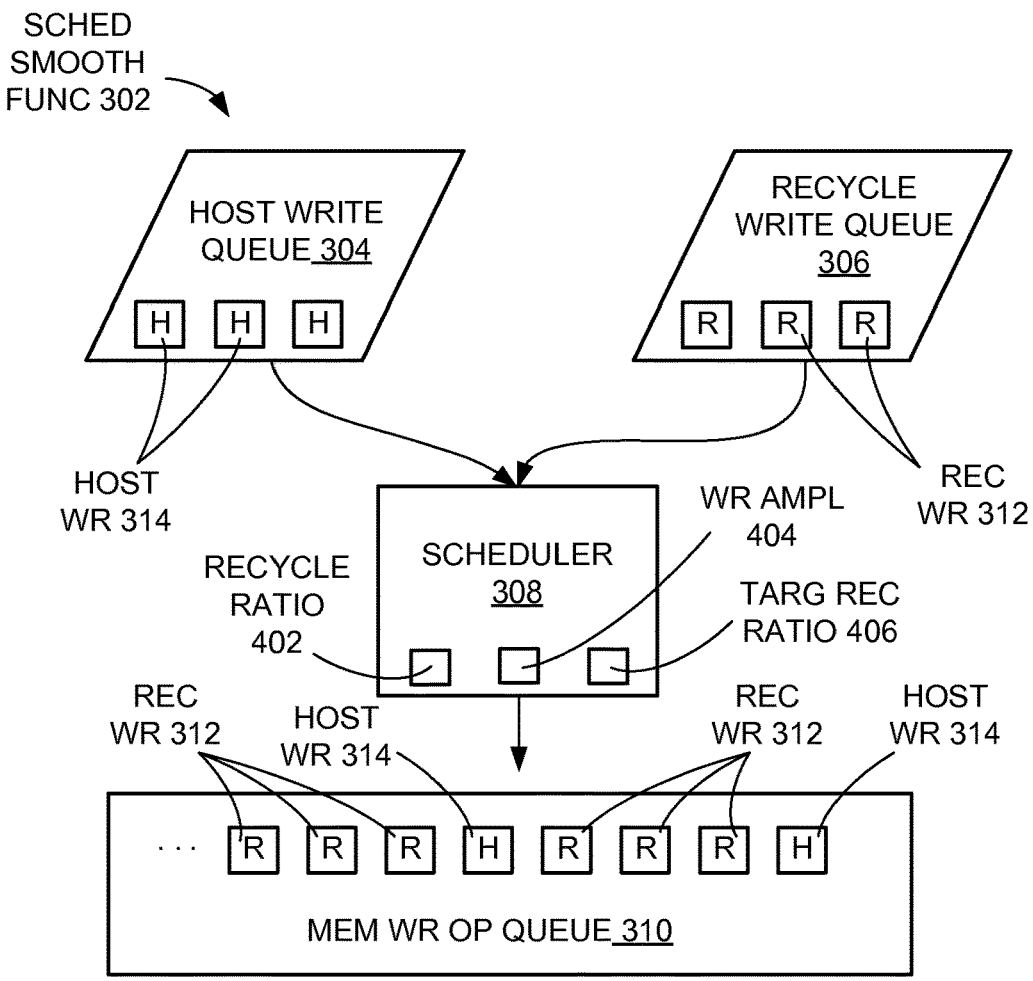
FIG. 4 is an exemplary diagram of the scheduler smoothing function.

Referring now to FIG. 4, therein is shown an exemplary diagram of the scheduler smoothing function 302. Generally, the scheduler smoothing function 302 can include the host write queue 304, the recycle write queue 306, the scheduler 308, and the memory write operation queue 310. However, in this embodiment, the scheduler smoothing function 302 can be targeted to a particular recycle ratio.

Generally, the memory devices 110 of FIG. 1 are limited by the bandwidth of a heavy write load. In order for the memory devices 110 to display uniform and/or even performance, the memory devices 110 should maintain a substantially even ratio of the recycle writes 312 and the host writes 314. Any deviation from this ratio from second to second can show up in Inputs and Outputs per Second (IOPS) and latency measurements. This ratio can be commonly referred to as a recycle ratio 402 (RR) and can be expressed as:

$$\text{Recycle Ratio} = \frac{\text{recycle writes}}{\text{physical data writes}} \quad (1)$$

Generally, a correlation can exist between a write amplification 404 (WA) and the recycle ratio 402 required for a particular value of the write amplification 404. This correlation can be expressed as:

$$RR = 1 - \frac{1}{WA} \quad (2)$$

The recycle ratio 402 can be expressed as a function of the write amplification 404. Particularly, the recycle ratio 402 can be expressed as one minus a reciprocal of the write amplification 404.

Accordingly, even though the embodiments described herein generally focus on the recycle ratio 402, the principles can apply equally well to a method and/or system that utilizes the write amplification 404 measurements. Per the embodiments described herein, the term "write amplification" is defined herein as a ratio of physical writes to a media compared to the host writes 314 to the memory device 110.

In at least one embodiment, the scheduler smoothing function 302 can target a desired value of the recycle ratio 402. For example, if the scheduler smoothing function 302 knows a ratio of the host writes 314 that it should perform relative to total writes, it can target that ratio in its scheduling and as a result be as responsive to the host system 108 of FIG. 1 as possible while fulfilling the recycling work that the memory devices 110 need to continue functioning.

Accordingly, after receiving inputs from the host write queue 304 and the recycle write queue 306, the scheduler smoothing function 302 can then organize these inputs pursuant to a predefined value of a target recycle ratio 406. Per the embodiments described herein, the term "target recycle ratio" is defined herein as a recycle ratio that a scheduling algorithm is targeting. This is abbreviated as $RR_t$.

For example, if the target recycle ratio 406 is 0.75, the scheduler smoothing function 302 can then output an instruction to the memory write operation queue 310 indicating that roughly three (3) of every four (4) writes should be the recycle writes 312. The target recycle ratio 406 of 0.75 is depicted in the memory write operation queue 310, wherein the order in which the scheduler smoothing function 302 can dispatch the write operations to the memory devices 110 is shown. However, it is to be understood that the target recycle ratio 406 is not limited to the preceding exemplary value of 0.75 and the target recycle ratio 406 can include any value between and including 0.0 and 1.0.

As such, when the behavior of the host system 108 varies and/or as the needs of the memory devices 110 change, the target recycle ratio 406 can change as well. Accordingly, in at least one embodiment of the invention, if the storage control system 100 of FIG. 1 determines that the scheduler smoothing function 302 would benefit from a new value of the target recycle ratio 406, the scheduler smoothing function 302 can be reprogrammed to use the new value of the target recycle ratio 406.

It has been discovered that the scheduler smoothing function 302 permits enhanced flexibility for the needs of the host system 108 and the memory devices 110. For example, the scheduler smoothing function 302 permits the storage control system 100 to perform the recycle writes 312 when there is none of the host writes 314 to schedule. As such, this enhanced flexibility allows the memory devices 110 to catch up or get ahead on the recycle writes 312 so that it does not have to perform as many later on if the host system 108 decides to perform more of the host writes 314.

It has been discovered that the enhanced flexibility of the scheduler smoothing function 302 also permits the memory devices 110 to perform a burst of the host writes 314 even if the recycle ratio 402 would normally indicate doing more of the recycle writes 312. The scheduler smoothing function 302 of the present embodiments permits a burst of the host writes 314 because the memory devices 110 can perform additional recycle writes later thereby providing better performance to the host system 108 in cases where the host write activity is burst oriented.

Figure 5:
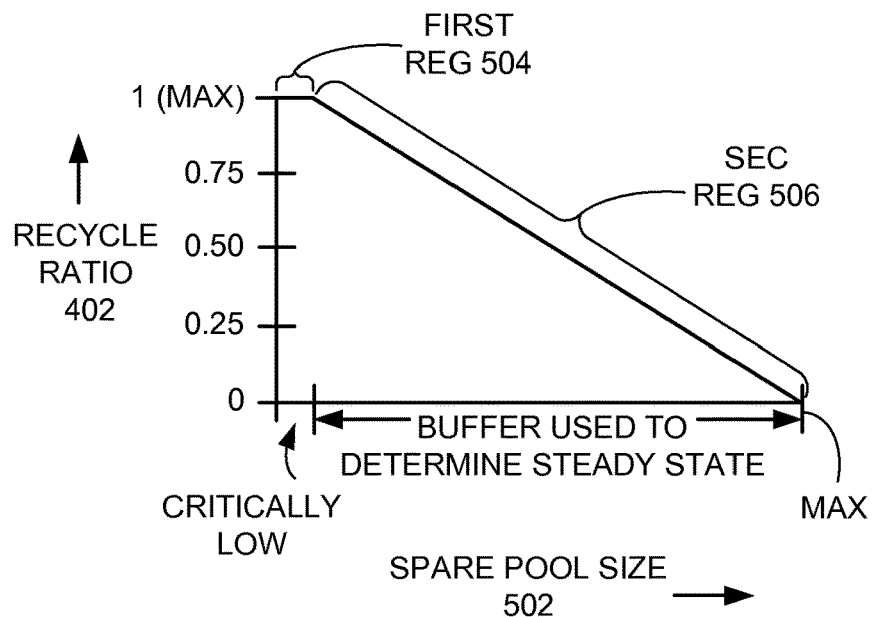
FIG. 5 is a first exemplary graph of the recycle ratio.

Referring now to FIG. 5, therein is shown a first exemplary graph of the recycle ratio 402. Generally, the first exemplary graph plots the recycle ratio 402 on the Y-axis against a spare pool size 502 on the X-axis. Per the embodiments described herein, the term "spare pool" is defined herein as erased memory that is available to be written to and can be in units of erase blocks. In at least one embodiment, the first exemplary graph can be used to determine a value for the target recycle ratio 406 of FIG. 4 that the storage control system 100 of FIG. 1 and/or the scheduler smoothing function 302 of FIGS. 3 and 4 can use.

Generally, the storage control system 100, when under a constant host workload, can dynamically determine a steady-state recycle ratio or the recycle ratio 402 from the first exemplary graph. In at least one embodiment, the steady state recycle ratio or value can be determined by having the storage control system 100 sample an available spare pool size or the spare pool size 502 and assigning a corresponding recycle ratio or the recycle ratio 402. As such, the recycle ratio 402 can be set based on a current size of a spare pool or the spare pool size 502.

Accordingly, in at least one embodiment, as the spare pool shrinks in size, the storage control system 100 can increase the recycle ratio 402. Conversely, as the spare pool increases in size, the memory system can decrease the recycle ratio 402. One possible correlation between the spare pool size 502 and the recycle ratio 402 is depicted in FIG. 5.

Generally, the first exemplary graph includes a first region 504 and a second region 506. The first region 504 can include a substantially horizontal portion of the graph wherein the value of the recycle ratio 402 remains substantially constant around a value of one (1) over a range of the spare pool size 502 that varies from zero (0) erase blocks left to a value deemed "critically low." The numerical value assigned to the qualitative term "critically low" can be predetermined or it can be empirically determined.

In at least one embodiment, factors used to empirically determine the value can include, but are not limited to, age of the memory devices 110 of FIG. 1, recent host performance requirements, latency history, bad block management, etc. In another embodiment, a "critically low" value can occur when a number of free erase blocks approaches approximately 0.1% of a total number of the erase blocks. In yet another embodiment, a "critically low" value can occur when a number of free or empty erase blocks is equal to or less than approximately 20 out of the 4,000 erase blocks on each die or each of the memory devices 110.

The second region 506 can include a substantially linear portion of the graph with a decreasing slope, wherein the value of the recycle ratio 402 decreases from around a value of one (1) to a value of zero (0). The value of the recycle ratio 402 can decrease over a range of the spare pool size 502 that varies from a value deemed "critically low" to a value corresponding to the "maximum" spare pool size. The numerical value assigned to the qualitative term "maximum" can be predetermined or it can be empirically determined.

In at least one embodiment, if the spare pool grows to a maximum size, the memory devices 110 can stop performing recycle operations because the recycle ratio 402 can be set to zero. However, it will be appreciated by those skilled in the art that the memory devices 110 need not totally stop performing recycle operations and can continue performing background-recycling operations. Generally, the value of the spare pool size 502 between "critically low" and "maximum" can act as a buffer region to help determine the potentially optimal steady state value for the recycle ratio 402.

It will be appreciated by those skilled in the art that if the recycle ratio 402 is not high enough to maintain a steady state for the storage control system 100, the size of the spare pool or the spare pool size 502 can decrease. Accordingly, in response, the first exemplary graph of the present embodiments would adjust the recycle ratio 402 to a higher value. In such cases, one of two things can happen: 1) the recycle ratio 402 can be set to a high enough value to be sustainable, or 2) the spare pool can become "critically low" and servicing of host operations can cease.

If the recycle ratio 402 is set to a high enough value to be sustainable, the storage control system 100 should reach a steady state in regards to a number of recycle operations that are performed for every host operation. It will be appreciated by those skilled in the art that when in this steady state, the spare pool size 502 changes very little, if at all.

If the spare pool becomes critically low and servicing of host operations ceases, the first exemplary graph can command the storage control system 100 to perform only recycle operations. In such cases, once the spare pool size 502 gets above this critically low mark, the recycle ratio 402 can be set to a value that allows some host operations to be serviced. It will be appreciated by those skilled in the art that this critically low mark should be used only in extreme cases as a safety net to prevent device failure or extended inoperable responses.

Once a steady state for a particular host workload is determined, the recycle ratio 402 and the host performance should be constant. However, when the host changes the workload, a different steady state can be required by the storage control system 100. For example, if the new workload requires a higher value of the recycle ratio 402, the spare pool can shrink and the storage control system 100 can adapt by increasing the recycle ratio 402 until it reaches a new steady state.

Conversely, if the new workload requires a lower value of the recycle ratio 402, the spare pool can slowly grow. It will be appreciated by those skilled in the art that in response to the larger spare pool, the recycle ratio 402 can decrease pursuant to the first exemplary graph thereby permitting more of the host writes 314 of FIG. 3 to be performed.

As such, a method and/or system have been discovered for dynamically adjusting the recycle ratio 402 of the memory devices 110. The dynamic adjustment of the recycle ratio 402 of the present embodiments happens directly because of the spare pool shrinking or growing in size, so the memory devices 110 do not have to try to predict the recycle ratio 402 that can be needed by the host system 108 of FIG. 1.

It will be appreciated by those skilled in the art that additional equations and/or curves can be used to translate the spare pool size 502 into a target value of the recycle ratio 402. Accordingly, the function or algorithm used to determine the recycle ratio 402 does not have to be linear in regards to the spare pool size 502. The function may be exponential, logarithmic, mapping, etc.

It will be appreciated by those skilled in the art that if the recycle ratio 402 reaches a value of one (1) (e.g., the maximum value), the scheduler smoothing function 302 need not service the host writes 314.

It will also be appreciated by those skilled in the art that the current embodiments permit the memory devices 110 to perform some recycling operations including the recycle writes 312 of FIG. 3 when there are no host operations including the host writes 314.

Figure 6:
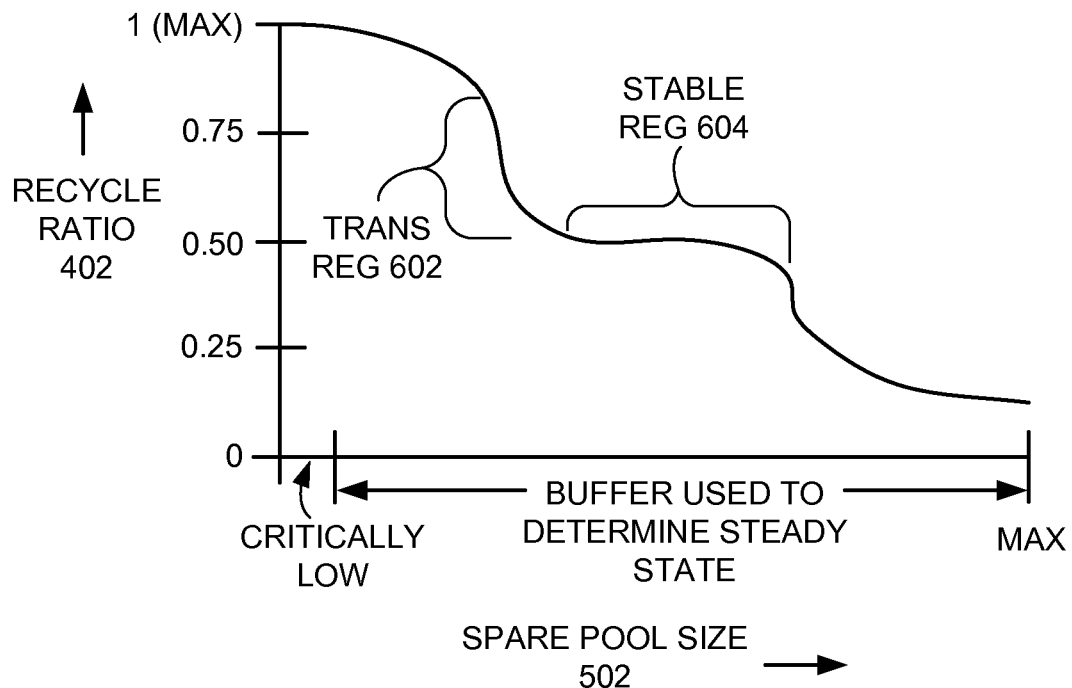
FIG. 6 is a second exemplary graph of the recycle ratio.

Referring now to FIG. 6, therein is shown a second exemplary graph of the recycle ratio 402. Generally, the second exemplary graph plots the recycle ratio 402 on the Y-axis against the spare pool size 502 on the X-axis. In at least one embodiment, the second exemplary graph can be used to determine a target value for the recycle ratio 402 that the storage control system 100 of FIG. 1 and/or the scheduler smoothing function 302 of FIGS. 3 and 4 can use. Per this embodiment, the second exemplary graph can include periods of little change in the recycle ratio 402 and periods of larger change in the recycle ratio 402.

The second exemplary graph can include a transition region 602 and a stable region 604. The transition region 602 includes a portion of the graph wherein the recycle ratio 402 experiences a relatively large change over a relatively small range of the spare pool size 502. In at least one embodiment, the recycle ratio 402 can change by five percent (5%) or more in the transition region 602.

The stable region 604 marks a portion of the second exemplary graph wherein the recycle ratio 402 remains relatively constant over a range of values of the spare pool size 502. By way of example and not by way of limitation, the spare pool size 502 can change by five percent (5%) or more in the stable region 604, while the recycle ratio 402 can remain relatively constant over that range. As such, the second exemplary graph permits a correlation between the recycle ratio 402 and the spare pool size 502 that can adjust in ranges.

It will be appreciated by those skilled in the art that additional equations and/or curves can be used to translate the spare pool size 502 into the target value of the recycle ratio 402. Accordingly, the function or algorithm used to determine the recycle ratio 402 does not have to be linear in regards to the spare pool size 502. The function can be exponential, logarithmic, mapping, etc.

Figure 7:
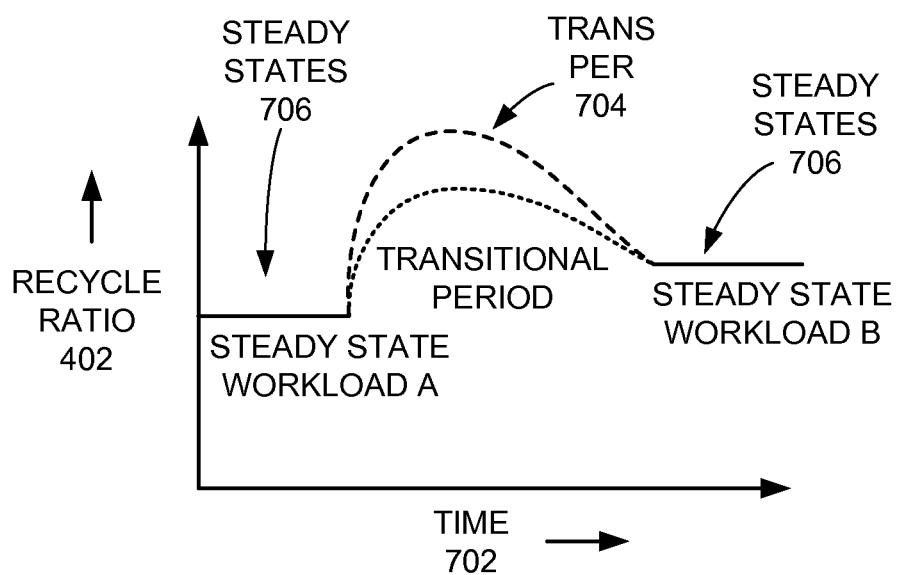
FIG. 7 is a third exemplary graph of the recycle ratio.

Referring now to FIG. 7, therein is shown a third exemplary graph of the recycle ratio 402. The third exemplary graph can include workload transitions. Generally, the third exemplary graph plots the recycle ratio 402 on the Y-axis against a time 702 on the X-axis. In at least one embodiment, the third exemplary graph can depict a transitional period 704 for the recycle ratio 402 that occurs between different steady states 706 that the storage control system 100 of FIG. 1 and/or the scheduler smoothing function 302 of FIGS. 3 and 4 can use.

Generally, when the host system 108 of FIG. 1 changes workloads, there can be the transitional period 704 when the recycle ratio 402 is higher than its new steady state. During this time, host performance may not be steady.

A dotted line depicts a transitional period response of the transitional period 704 for the embodiments described herein, wherein host performance degradation is minimized. It will be appreciated by those skilled in the art that host performance degradation is minimized with the transitional period response of the dotted line because the change in the recycle ratio 402 is minimized. A dashed line above the dotted line depicts another transitional period response of the transitional period 704 wherein the host experiences greater host performance degradation due to the larger increase in the recycle ratio 402.

It has been discovered that by using the recycle ratio 402 functions described herein and/or the spare pool size 502 of FIG. 5 described herein that the uneven host performance caused by workload transitions is significantly reduced.

Figure 8:
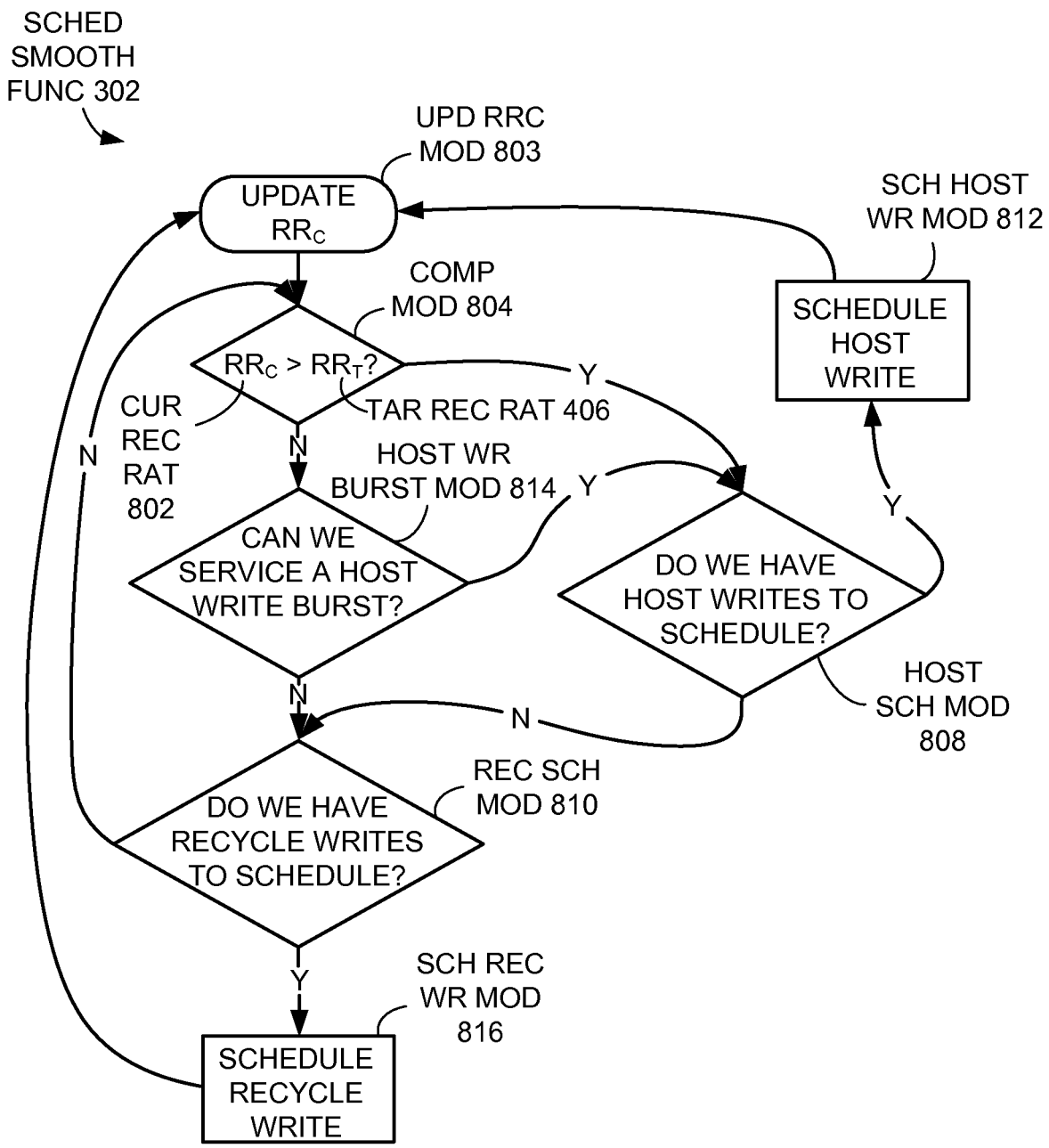
FIG. 8 is a control flow of the scheduler smoothing function.

Referring now to FIG. 8, therein is shown a control flow of the scheduler smoothing function 302. The scheduler smoothing function 302 can be implemented in the memory controller 104 of FIG. 1 with the host write queue 304 of FIG. 3, the recycle write queue 306 of FIG. 3, the scheduler 308 of FIG. 3, and the memory write operation queue 310 of FIG. 3. The control flow depicts the scheduler smoothing function 302 implemented as a smoothing feedback loop. Generally, the smoothing feedback loop teaches how to perform the mixing of the host writes 314 of FIG. 3 and the recycle writes 312 of FIG. 3 that the scheduler smoothing function 302 implements.

In at least one embodiment, the scheduler smoothing function 302 can implement the recycle ratio 402 of FIG. 4 by using the smoothing feedback loop to determine whether the scheduler smoothing function 302 needs to schedule one of the host writes 314 or the recycle writes 312 next. In such cases, the smoothing feedback loop can track and/or manipulate a current recycle ratio 802 ($RR_c$) that the scheduler smoothing function 302 has sent out. Per the embodiments described herein, the term "current recycle ratio" is defined herein as a recycle ratio that a scheduling algorithm has been achieving over a predetermined recent history. This is abbreviated as $RR_c$.

The smoothing feedback loop can begin with an update $RR_c$ module 803. The update $RR_c$ module 803 ensures that the smoothing feedback loop utilizes the most current recycle ratio or the most current value of the recycle ratio 402 for its algorithm or calculation. In at least one embodiment, the update $RR_c$ module 803 can determine the current recycle ratio 802 or a current value of the recycle ratio 402 by utilizing inputs from a schedule host write module 812 and/or a schedule recycle write module 816. The current value of the recycle ratio 402 of the update $RR_c$ module 803 can then be fed to a comparison module 804.

In the comparison module 804, the current recycle ratio 802 can be compared to the target recycle ratio 406 (RR). Generally, if the current recycle ratio 802 is greater than or equal to the target recycle ratio 406, the smoothing feedback loop can choose a first path. If the current recycle ratio 802 is less than the target recycle ratio 406, the smoothing feedback loop can choose a second path.

Accordingly, in at least one embodiment, if the current recycle ratio 802 is greater than or equal to the target recycle ratio 406 ($RR_c \geq RR_t$), the smoothing feedback loop can then move to a host scheduler module 808. Upon receiving an input from the comparison module 804, the host scheduler module 808 can determine if there is one of the host writes 314 to schedule. If there is one of the host writes 314 to schedule, the smoothing feedback loop can then move to the schedule host write module 812. The schedule host write module 812 can then send its schedule host write request to the update $RR_c$ module 803 to be used in determining the current recycle ratio 802.

If there is none of the host writes 314 to schedule at the host scheduler module 808, the smoothing feedback loop can then move to a recycle scheduler module 810. If there is one of the recycle writes 312 to schedule, the smoothing feedback loop can then move to the schedule recycle write module 816. The schedule recycle write module 816 can then send its schedule recycle write request to the update $RR_c$ module 803 to be used in determining the current recycle ratio 802. If there is none of the recycle writes 312 to schedule when the smoothing feedback loop reaches the recycle scheduler module 810, the smoothing feedback loop can then move back to the comparison module 804.

In another embodiment, if the current recycle ratio 802 is less than the target recycle ratio 406 ($RR_c < RR_t$) or there is none of the recycle writes 312 to schedule from the recycle scheduler module 810 when the smoothing feedback loop reaches the comparison module 804, the smoothing feedback loop can then move to a host write burst module 814. If the smoothing feedback loop determines that a host write burst can be performed at the host write burst module 814, the smoothing feedback loop can then move to the host scheduler module 808 and can proceed as described above. If the smoothing feedback loop determines that a host write burst cannot be performed at the host write burst module 814, the smoothing feedback loop can then move to the recycle scheduler module 810 and can proceed as described above.

It will be appreciated by those skilled in the art that the smoothing feedback loop optimizes host performance by keeping the current recycle ratio 802 close to the target recycle ratio 406 when a steady stream of host activity is observed. By way of example and not by way of limitation, when the steady stream of the host activity is observed, the current recycle ratio 802 is kept within plus or minus ten percent (10%) of the target recycle ratio 406.

It will be appreciated by those skilled in the art that the smoothing feedback loop optimizes host performance by allowing the current recycle ratio 802 to drop relative to the target recycle ratio 406 for a short period of time when a burst of the host activity is observed. By way of example and not by way of limitation, the current recycle ratio 802 varies by about ten percent (10%) from the target recycle ratio 406 in such instances.

It will be appreciated by those skilled in the art that the smoothing feedback loop optimizes host performance by allowing the current recycle ratio 802 to grow or increase relative to the target recycle ratio 406 for a period of time when a lull in host activity is observed. By way of example and not by way of limitation, the current recycle ratio 802 varies by about ten percent (10%) from the target recycle ratio 406 in such instances.

It has been discovered that such a method and/or system enhances the flexibility of the memory devices 110 of FIG. 1 by allowing the smoothing feedback loop and/or the scheduler smoothing function 302 to handle various scenarios and track how far it has deviated from the target recycle ratio 406. At the same time, the smoothing feedback loop and/or the scheduler smoothing function 302 are permitted to converge on the actual value of the target recycle ratio 406 later.

Functions or operations of the memory controller 104 as described above can be implemented in hardware, software, or a combination thereof. The memory controller 104 can be implemented with the control unit 202 of FIG. 2, the storage unit 204 of FIG. 2, the memory interface unit 206 of FIG. 2, the host interface unit 208 of FIG. 2, or a combination thereof.

For example, the update $RR_c$ module 803 can be implemented with the control unit 202 to ensure that the smoothing feedback loop utilizes the most current value of the recycle ratio 402 and determine the current value of the recycle ratio 402 by utilizing inputs from the schedule host write module 812 and/or the schedule recycle write module 816. Also for example, the comparison module 804 can be implemented with the control unit 202 to compare the current recycle ratio 802 to the target recycle ratio 406.

For example, the host scheduler module 808 can be implemented with the control unit 202 to determine if there is one of the host writes 314 to schedule. Also for example, the recycle scheduler module 810 can be implemented with the control unit 202 to determine if there is one of the recycle writes 312 to schedule.

For example, the schedule host write module 812 can be implemented with the control unit 202 to schedule the host writes 314. Also for example, the host write burst module 814 can be implemented with the control unit 202 to determine if a host write burst can be performed. Further, for example, the schedule recycle write module 816 can be implemented with the control unit 202 to schedule one of the recycle writes 312.

The update $RR_c$ module 803 can be coupled to the comparison module 804, the schedule host write module 812, and the schedule recycle write module 816. The comparison module 804 can be coupled to the host scheduler module 808, the recycle scheduler module 810, and the host write burst module 814.

The host scheduler module 808 can be coupled to the recycle scheduler module 810, the schedule host write module 812, and the host write burst module 814. The recycle scheduler module 810 can be coupled to the host write burst module 814 and the schedule recycle write module 816.

The storage control system 100 of FIG. 1 is described with module functions or order as an example. The modules can be partitioned differently. For example, the recycle scheduler module 810 and the schedule recycle write module 816 can be combined. Each of the modules can operate individually and independently of the other modules.

Furthermore, data generated in one module can be used by another module without being directly coupled to each other. The update $RR_c$ module 803, the comparison module 804, and the host scheduler module 808 can be implemented as hardware accelerators (not shown) within the control unit 202 or can be implemented as hardware accelerators (not shown) in the memory controller 104 or outside of the memory controller 104. The recycle scheduler module 810, the schedule host write module 812, the host write burst module 814, and the schedule recycle write module 816 can be implemented as hardware accelerators (not shown) within the control unit 202 or can be implemented as hardware accelerators (not shown) in the memory controller 104 or outside of the memory controller 104.

Figure 9:
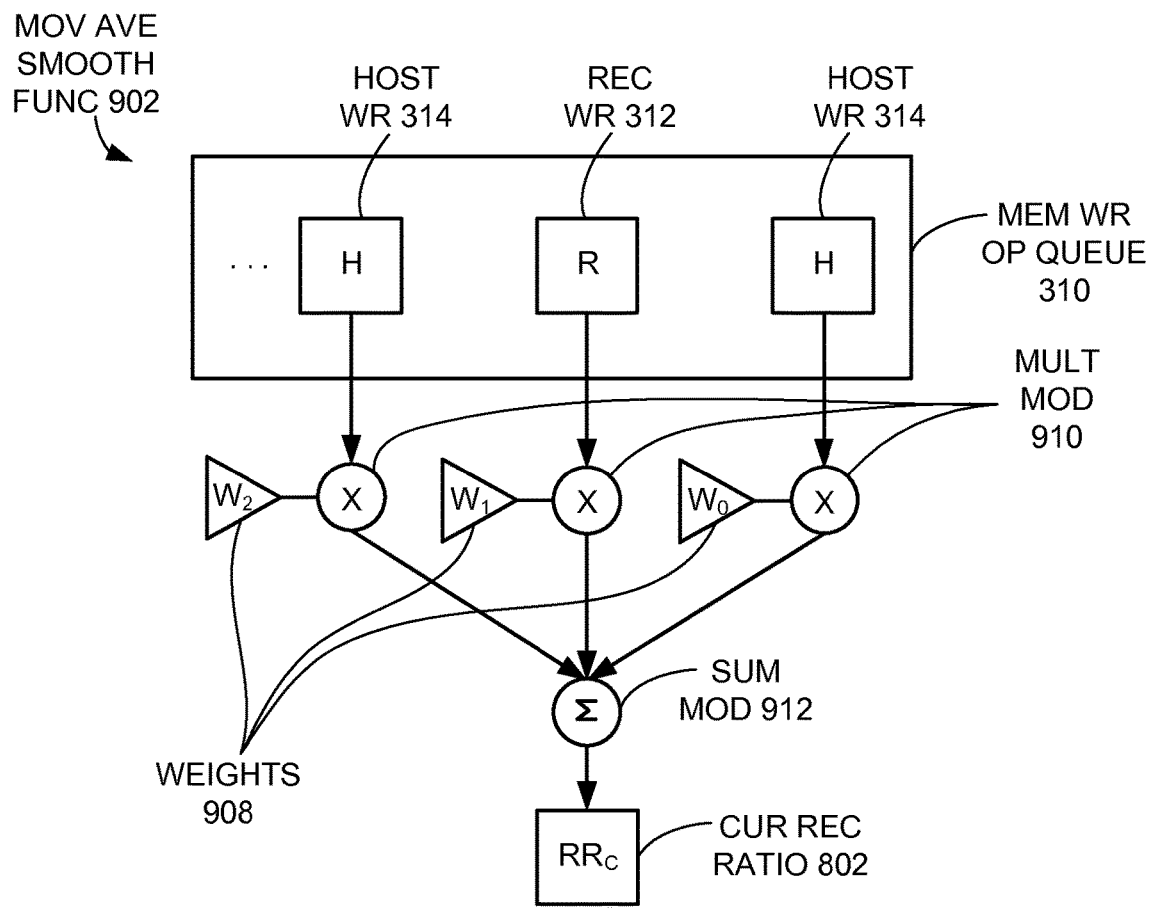
FIG. 9 is a functional block diagram of a moving average smoothing function of the scheduler smoothing function of FIG. 3.

Referring now to FIG. 9, therein is shown a functional block diagram of a moving average smoothing function 902 of the scheduler smoothing function 302 of FIG. 3. Generally, the moving average smoothing function 902 can be used to implement the scheduler smoothing function 302. The functional block diagram can include a smoothing functional circuit. Note that although this diagram is in circuit form, it can be implemented in software, hardware, or a combination thereof as well.

In at least one embodiment, a moving average of recent writes can be used to adjust the current recycle ratio 802. In such cases, the moving average of the recent writes can be sampled from a flash write operation queue or the memory write operation queue 310.

The memory write operation queue 310 can include one or more write commands, including the host writes 314 and/or the recycle writes 312. The host writes 314 and the recycle writes 312 within the memory write operation queue 310 can be recent write operations.

The recent write operations can be given weighting factors or weights 908 using multiplication modules 910. Based on the weights 908, the moving average smoothing function 902 can determine whether the host writes 314 or the recycle writes 312 should happen next. The moving average smoothing function 902 can also feed the decision into a recent history window so that it can influence the next decision. Outputs of the multiplication modules 910 can be fed to a summation module 912 to calculate the current recycle ratio 802.

Functions or operations of the memory controller 104 of FIG. 1 as described above can be implemented in hardware, software, or a combination thereof. The memory controller 104 can be implemented with the control unit 202 of FIG. 2, the storage unit 204 of FIG. 2, the memory interface unit 206 of FIG. 2, the host interface unit 208 of FIG. 2, or a combination thereof.

For example, the multiplication modules 910 can be implemented with the control unit 202 to multiply the recent write operations, including the recycle writes 312 and the host writes 314, and the weights 908. Also for example, the summation module 912 can be implemented with the control unit 202 to calculate the current recycle ratio 802 based on the outputs or results of the multiplication modules 910. The multiplication modules 910 can be coupled to the summation module 912 and the memory write operation queue 310.

The storage control system 100 of FIG. 1 is described with module functions or order as an example. The modules can be partitioned differently. For example, the multiplication modules 910 and the summation module 912 can be combined. Each of the modules can operate individually and independently of the other modules.

Furthermore, data generated in one module can be used by another module without being directly coupled to each other. The multiplication modules 910 and the summation module 912 can be implemented as hardware accelerators (not shown) within the control unit 202 or can be implemented as hardware accelerators (not shown) in the memory controller 104 or outside of the memory controller 104.

Figure 10:
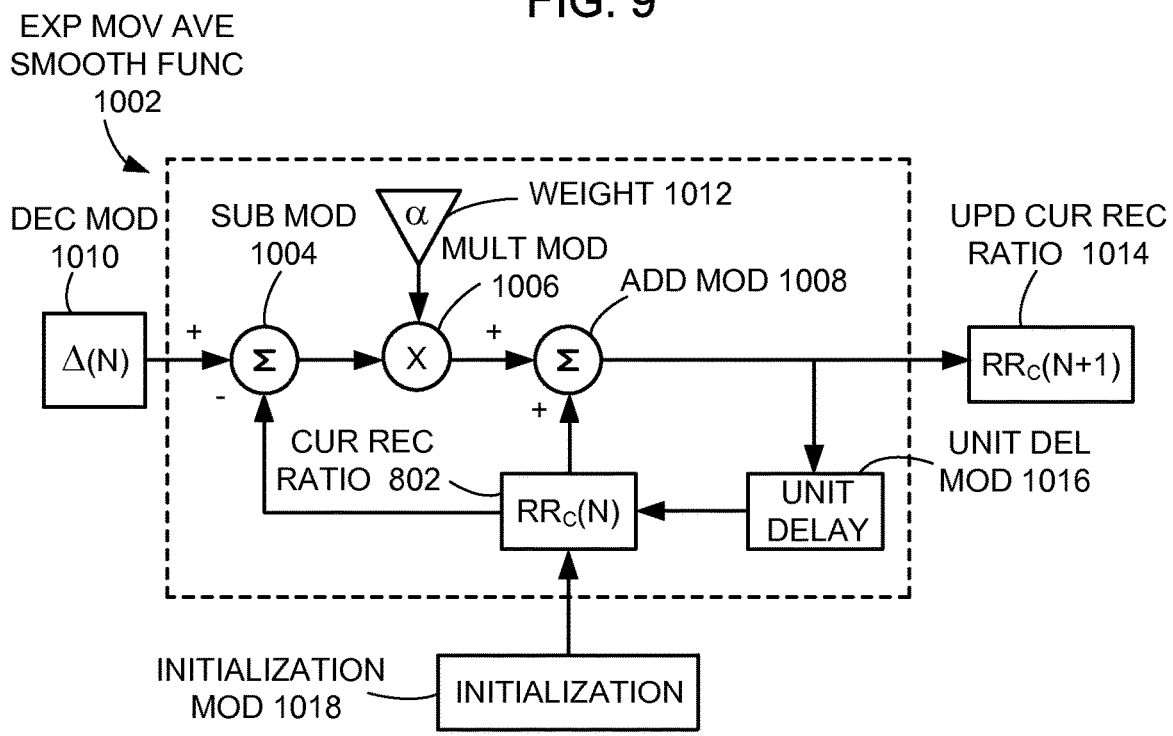
FIG. 10 is a functional block diagram of an exponential moving average smoothing function of the scheduler smoothing function of FIG. 3.

Referring now to FIG. 10, therein is shown a functional block diagram of an exponential moving average smoothing function 1002 of the scheduler smoothing function 302 of FIG. 3. Generally, the exponential moving average smoothing function 1002 can be used to implement the scheduler smoothing function 302. The functional block diagram can include a smoothing functional circuit. Note that although this diagram is in circuit form, it can be implemented in software, hardware, or a combination thereof as well.

A preferred method of tracking the current recycle ratio 802 using a moving average can include an exponential moving average because it can be the easiest to compute. The exponential moving average can be the easiest to compute because it can require only the current recycle ratio 802, denoted as $RR_C(n)$, not a buffer of previous decisions.

The exponential moving average can require no divisions, but instead, just or only a subtraction module 1004, a multiplication module 1006, and an addition module 1008 each time. In addition, the exponential moving average can behave well on fixed-point hardware. If all writes for a chosen window size are given equal weights, the smoothing function can be a simple-moving average function that is similar to a batch smoothing function, which will be subsequently described.

The functional block diagram depicts a decision module 1010, which determines a decision, denoted as $\Delta(n)$, of whether the host writes 314 of FIG. 3 or the recycle writes 312 of FIG. 3 should happen next. The decision module 1010 can provide the decision as an input to the subtraction module 1004. The subtraction module 1004 can subtract the current recycle ratio 802 from the decision. In FIG. 10, $\Delta(n)$ can have a value of "0" or "1" when one of the host writes 314 or the recycle writes 312, respectively, is to occur at time n.

A subtraction result from the subtraction module 1004 can be multiplied by an exponential average parameter or a weight 1012, denoted as $\alpha$, by the multiplication module 1006, a result of which can then be added to the current recycle ratio 802 by the addition module 1008 to generate an updated current recycle ratio 1014, denoted as $RR_C(N+1)$. The updated current recycle ratio 1014 can be fed to a unit delay module 1016 to delay the updated current recycle ratio 1014 by a predetermined unit of time to generate a value of the current recycle ratio 802 for subsequent processing.

The functional block diagram depicts an initialization module 1018. The initialization module 1018 configures the current recycle ratio 802 ($RR_c$) for the scheduler smoothing function 302. For example, a good starting point is to set the current recycle ratio 802 to be equal to the target recycle ratio 406 ($RR_t$) of FIG. 4.

In the drive, the target recycle ratio 406 can be calculated every time the spare pool size 502 of FIG. 5 changes, and the current recycle ratio 802 can be immediately set to a new ratio that is equal to the target recycle ratio 406 so the scheduler 308 of FIG. 3 can start recycling to the new ratio. If the current recycle ratio 802 were not set to be equal to the target recycle ratio 406 when the target recycle ratio 406 moved or changed and if there was a gap between the current recycle ratio 802 and the target recycle ratio 406, we could end up with a burst of only the host writes 314 or the recycle writes 312 getting serviced.

Functions or operations of the memory controller 104 of FIG. 1 as described above can be implemented in hardware, software, or a combination thereof. The memory controller 104 can be implemented with the control unit 202 of FIG. 2, the storage unit 204 of FIG. 2, the memory interface unit 206 of FIG. 2, the host interface unit 208 of FIG. 2, or a combination thereof.

For example, the subtraction module 1004 can be implemented with the control unit 202 to subtract the current recycle ratio 802 from the decision of whether the host writes 314 or the recycle writes 312 should happen next. Also for example, the multiplication module 1006 can be implemented with the control unit 202 to multiply the subtraction result from the subtraction module 1004 by the weight 1012.

For example, the addition module 1008 can be implemented with the control unit 202 to add the result of the multiplication module 1006 to the current recycle ratio 802 to generate the updated current recycle ratio 1014. Also for example, the decision module 1010 can be implemented with the control unit 202 to determine the decision of whether the host writes 314 or the recycle writes 312 should happen next.

For example, the unit delay module 1016 can be implemented with the control unit 202 to delay the updated current recycle ratio 1014 by the predetermined unit of time to generate the value of the current recycle ratio 802. Also for example, the initialization module 1018 can be implemented with the control unit 202 to generate and supply initialization parameters for the target recycle ratio 406 of FIG. 4.

The subtraction module 1004 can be coupled to the multiplication module 1006, the decision module 1010, and the initialization module 1018. The decision module 1010 can be coupled to the addition module 1008. The addition module 1008 can be coupled to the unit delay module 1016 and the initialization module 1018.

The storage control system 100 of FIG. 1 is described with module functions or order as an example. The modules can be partitioned differently. For example, the subtraction module 1004 and the multiplication module 1006 can be combined. Each of the modules can operate individually and independently of the other modules.

Furthermore, data generated in one module can be used by another module without being directly coupled to each other. The subtraction module 1004, the multiplication module 1006, the addition module 1008, the decision module 1010, the unit delay module 1016, and the initialization module 1018 can be implemented as hardware accelerators (not shown) within the control unit 202 or can be implemented as hardware accelerators (not shown) in the memory controller 104 or outside of the memory controller 104.

Figure 11:
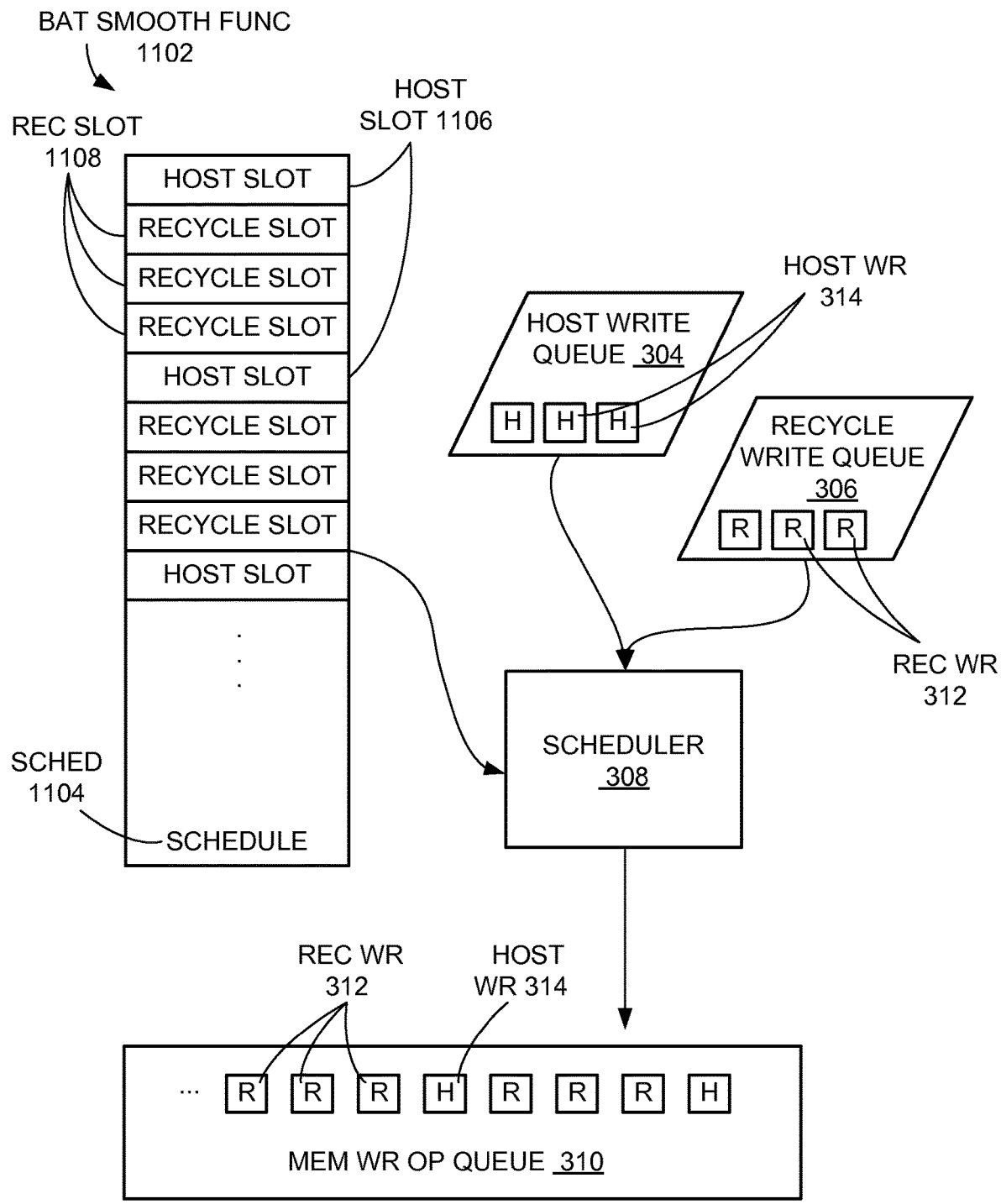
FIG. 11 is a functional block diagram of a batch smoothing function of the scheduler smoothing function of FIG. 3.

Referring now to FIG. 11, therein is shown a functional block diagram of a batch smoothing function 1102 of the scheduler smoothing function 302 of FIG. 3. Generally, the batch smoothing function 1102 can be used to implement the scheduler smoothing function 302. The functional block diagram can include a smoothing functional circuit.

This type of smoothing function considers work in batches, using the target recycle ratio 406 of FIG. 4 to decide how many of the host writes 314 and the recycle writes 312 to schedule for that batch. That is, at the start of each batch, the smoothing function can create a schedule 1104 of an order in which host and recycle work can occur for that batch.

For example, FIG. 11 depicts the storage control system 100 of FIG. 1 having the target recycle ratio 406 of 0.75. At the start of each batch, the scheduler 308 can create the schedule 1104 with the host writes 314 and the recycle writes 312, which the scheduler 308 plans to perform for that batch.

The scheduler 308 can then work its way down the scheduler 308, pulling from an appropriate write queue for a host slot 1106 or a recycle slot 1108, for which the scheduler 308 is currently processes. The appropriate write queue can be the host write queue 304 or the recycle write queue 306. The scheduler 308 can pull the host writes 314 or the recycle writes 312 from the appropriate write queue for the host slot 1106 or the recycle slot 1108, respectively.

The scheduler 308 can update the memory write operation queue 310 with an order by which the host writes 314 and the recycle writes 312 are executed. When a batch completes, the scheduler 308 can create a new schedule or another of the schedule 1104, if necessary.

With the batch smoothing function 1102, the scheduler 308 can still choose to deviate from the target recycle ratio 406 for periods of time, as indicated in FIG. 8. Thus, with the batch smoothing function 1102, there is still a feedback loop to ensure that a device or the memory controller 104 of FIG. 1 can be continually converging on the target recycle ratio 406.

It has been discovered that the memory sub-system 102 of FIG. 1 including a solid-state drive (SSD) employing the scheduler smoothing function 302 for scheduling a mixture of the host writes 314 and the recycle writes 312 improves host performance. The host performance is improved by maintaining steady host performance and consistent host command latencies for providing even performance to the host system 108 of FIG. 1.

It has also been discovered that the memory sub-system 102 including the SSD with the scheduler smoothing function 302 that utilizes the target recycle ratio 406 improves host performance. The host performance is improved by using the target recycle ratio 406 to schedule the mixture of the host writes 314 and the recycle writes 312 to maintain steady host performance and consistent host command latencies.

It has further been discovered that the memory sub-system 102 including the SSD with the scheduler smoothing function 302 that utilizes a target write amplification to schedule a mixture of the host writes 314 and the recycle writes 312 improves host performance by providing steady host performance and consistent host command latencies.

It has further been discovered that the memory sub-system 102 dynamically determining the recycle ratio 402 of FIG. 4 provides a steady state host performance and consistent host command latencies thereby improving host performance.

It has further been discovered that the memory sub-system 102 adjusting the recycle ratio 402 based on the spare pool size 502 of FIG. 5 provides a steady state host performance and consistent host command latencies thereby improving host performance.

It has further been discovered that the scheduler smoothing function 302 ceases servicing the host writes 314 only if the recycle ratio 402 reaches one (1) or the spare pool size 502 becomes critically low provides improved reliability by servicing only the recycle writes 312 to increase the spare pool size 502 to prevent device failure or extended inoperable responses.

It has further been discovered that the memory sub-system 102 including the SSD stops or ceases to perform recycle operations or the recycle writes 312 altogether if the recycle ratio 402 becomes zero improves host performance by servicing only the host writes 314 in response to the larger spare pool.

It has further been discovered that the memory sub-system 102 including the SSD continues to perform the recycling operations in the background at a low rate if the recycle ratio 402 becomes zero improves host performance by servicing more of the host writes 314 in response to the larger spare pool.

It has further been discovered that the memory sub-system 102 optimizes host performance by adjusting the recycle ratio 402 and the spare pool size 502 to help even out host performance during workload transitions or the transitional period 704 of FIG. 7.

It has further been discovered that the memory sub-system 102 including the SSD performing some of the recycle writes 312 when there are no host operations or the host writes 314 provides improved reliability. The improved reliability is provided because the recycle writes 312 increase the spare pool size 502 thereby preventing device failure or extended inoperable responses.

It has further been discovered that a solid-state drive (SSD) or the memory sub-system 102 that updates the target recycle ratio 406 based on host and drive activity to update the scheduler smoothing function 302 improves host performance by maintaining steady host performance and consistent host command latencies. The target recycle ratio 406 is updated based on the host and drive activity based on an appropriate mixture of the host writes 314 and the recycle writes 312.

It has further been discovered that the SSD or the memory sub-system 102 with the scheduler smoothing function 302 that employs the smoothing feedback loop improves host performance by maintaining steady host performance and consistent host command latencies. The host performance is improved using the smoothing feedback loop to converge on the target recycle ratio 406.

It has further been discovered that the SSD or the memory sub-system 102 with the scheduler smoothing function 302 that schedules a mixture by utilizing the moving average smoothing function 902 of FIG. 9 improves host performance by maintaining steady host performance and consistent host command latencies. The moving average smoothing function 902 improves host performance using a moving average of recent scheduling activity, including the host writes 314 and the recycle writes 312, and comparing it to the target recycle ratio 406.

It has further been discovered that the SSD or the memory sub-system 102 with the scheduler smoothing function 302 that allows the SSD to get ahead on its maintenance/recycling work improves host performance by maintaining steady host performance and consistent host command latencies. The SSD gets ahead on its maintenance/recycling work by scheduling extra cycles for the recycle writes 312 when the host system 108 is not sending full of the host writes 314.

It has further been discovered that the SSD or the memory sub-system 102 with the scheduler smoothing function 302 that allows the SSD to service a burst of the host writes 314 improves host performance by maintaining steady host performance and consistent host command latencies. The host performance is improved by the comparison module 804 of FIG. 8, the host scheduler module 808 of FIG. 8, and the schedule host write module 812 of FIG. 8 to provide a quick response to the host system 108 and catch up in the target recycle ratio 406 later.

It has further been discovered that the SSD or the memory sub-system 102 with the scheduler smoothing function 302 that schedules a mixture of the host writes 314 and the recycle writes 312 improves host performance by maintaining steady host performance and consistent host command latencies. The host performance is improved by choosing which types of writes to schedule, including the host writes 314 and the recycle writes 312, in batches using the batch smoothing function 1102 in accordance with the target recycle ratio 406.

The physical transformation of scheduling the recycle writes 312 and the host writes 314 based on the recycle ratio 402 for writing to the memory devices 110 of FIG. 1 results in movement in the physical world, such as people using the memory sub-system 102 based on the operation of the storage control system 100. As the movement in the physical world occurs, the movement itself creates additional information that is converted back in to receiving the recycle writes 312 from the recycle write queue 306 and receiving the host writes 314 from the host write queue 304 for the continued operation of the storage control system 100 and to continue the movement in the physical world.

Figure 12:
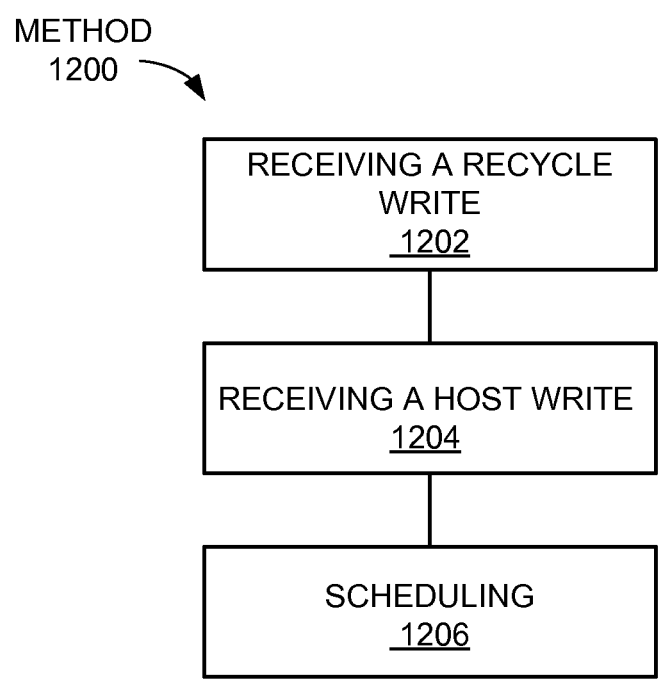
FIG. 12 is a flow chart of a method of operation of a storage control system in a further embodiment of the present invention.

Referring now to FIG. 12, therein is shown a flow chart of a method 1200 of operation of a storage control system in a further embodiment of the present invention. The method 1200 includes: receiving a recycle write from a recycle write queue in a block 1202; receiving a host write from a host write queue in a block 1204; and scheduling the recycle write and the host write for writing to a memory device in a block 1206.

Thus, it has been discovered that the storage control system of the present invention furnishes important and heretofore unknown and unavailable solutions, capabilities, and functional aspects for a storage control system with data management mechanism. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a storage control system for a memory device comprising:
    receiving at least one recycle write from a recycle write queue;
    receiving at least one host write from a host write queue;
    identifying a target recycle ratio in accordance with a current size of a spare pool of erased non-volatile memory blocks available to be written to, wherein the target recycle ratio is a targeted ratio of recycling page writes to host page writes;
    placing the at least one recycle write and the at least one host write in a write operation queue in accordance with the target recycle ratio;
    dispatching the at least one recycle write and the at least one host write from the write operation queue for writing data to the memory device;
    during operation of the storage control system, updating the target recycle ratio in accordance with a change in the current size of the spare pool; and
    after updating the target recycle ratio:
        placing one or more recycle writes and one or more host writes in the write operation queue in accordance with the updated target recycle ratio; and
        dispatching the one or more recycle writes and the one or more host writes from the write operation queue for writing data to the memory device.

2. The method as claimed in claim 1 wherein updating the target recycle ratio in accordance with a change in the current size of the spare pool comprises increasing the target recycle ratio in accordance with a decrease in size of the spare pool or decreasing the target recycle ratio in accordance with an increase in size of the spare pool.

3. The method as claimed in claim 1, wherein identifying a target recycle ratio includes the storage control system dynamically determining a first steady-state recycle ratio in a first steady state of the storage control system with respect to number of recycle write operations that are performed per host page write operation; and
    wherein updating the target recycle ratio in accordance with a change in the current size of the spare pool includes detecting a change in the current size of the spare pool that satisfies predefined criteria, and the storage control system, in response to detecting the change in the current size of the spare pool that satisfies the predefined criteria, updating the target recycle ratio to a second steady-state recycle ratio in a second steady state of the storage control system with respect to number of recycle write operations that are performed per host page write operation, wherein the second steady-state recycle ratio is different from the first steady-state recycle ratio.

4. The method as claimed in claim 1 wherein identifying a target recycle ratio includes identifying the target recycle ratio based on an exponential moving average smoothing function by tracking a current recycle ratio.

5. The method as claimed in claim 1 wherein identifying a target recycle ratio includes identifying the target recycle ratio based on a smoothing feedback loop that compares a current recycle ratio to a target recycle ratio.

6. The method as claimed in claim 1 wherein identifying a target recycle ratio includes identifying the target recycle ratio based on a recycle ratio as a function of a reciprocal of a write amplification.

7. The method as claimed in claim 1 wherein identifying a target recycle ratio includes identifying the target recycle ratio based on a smoothing feedback loop when the at least one host write is not scheduled and a current recycle ratio is greater than the target recycle ratio.

8. A storage control system for controlling operation of a non-volatile memory device coupled to the storage control system, the storage control system comprising:
    a recycle write queue for providing at least one recycle write;
    a host write queue for providing at least one host write; and
    a memory controller coupled to the memory device, the memory controller having one or more processors and including a scheduler module, coupled to the recycle write queue and the host write queue, for:
        identifying a target recycle ratio in accordance with a current size of a spare pool of erased non-volatile memory blocks available to be written to, wherein the target recycle ratio is a targeted ratio of recycling page writes to host page writes;
        placing the at least one recycle write and the at least one host write in a write operation queue in accordance with the target recycle ratio;
        dispatching the at least one recycle write and the at least one host write from the write operation queue for writing data to the non-volatile memory device coupled to the storage control system;
        during operation of the storage control system, updating the target recycle ratio in accordance with a change in the current size of the spare pool; and
        after updating the target recycle ratio:
            placing one or more recycle writes and one or more host writes in the write operation queue in accordance with the updated target recycle ratio; and dispatching the one or more recycle writes and the one or more host writes from the write operation queue for writing data to the memory device.

9. The system as claimed in claim 8 wherein the scheduler module is for increasing the target recycle ratio in accordance with a decrease in size of the spare pool or decreasing the target recycle ratio in accordance with an increase in size of the spare pool.

10. The system as claimed in claim 8 wherein the scheduler module is for dynamically determining a first steady-state recycle ratio in a first steady state of the storage control system with respect to number of recycle write operations that are performed per host page write operation; and wherein the scheduler module is also for detecting a change in the current size of the spare pool that satisfies predefined criteria, and in response to detecting the change in the current size of the spare pool that satisfies the predefined criteria, updating the target recycle ratio to a second steady-state recycle ratio in a second steady state of the storage control system with respect to number of recycle write operations that are performed per host page write operation, wherein the second steady-state recycle ratio is different from the first steady-state recycle ratio.

11. The system as claimed in claim 8 wherein the scheduler is for identifying the target recycle ratio based on an exponential moving average smoothing function by tracking a current recycle ratio.

12. The system as claimed in claim 8 wherein the scheduler is for identifying the target recycle ratio based on a smoothing feedback loop that compares a current recycle ratio to a target recycle ratio.

13. The system as claimed in claim 8 wherein the scheduler is for identifying the target recycle ratio based on a recycle ratio as a function of a reciprocal of a write amplification.

14. The system as claimed in claim 8 wherein the scheduler is for identifying the target recycle ratio based on an exponential moving average smoothing function by tracking a current recycle ratio with a subtraction module, a multiplication module, and an addition module.

15. The system as claimed in claim 8 wherein the scheduler is for identifying the target recycle ratio based on a smoothing feedback loop when the at least one host write is not scheduled and a current recycle ratio is greater than the target recycle ratio.

* * * * *